United States Patent
Wakatsuki et al.

(10) Patent No.: US 8,742,592 B2
(45) Date of Patent: Jun. 3, 2014

(54) SEMICONDUCTOR DEVICE INCLUDING A PLUG AND METHOD FOR MANUFACTURING THE SAME

(75) Inventors: Satoshi Wakatsuki, Yokohama (JP); Ichiro Mizushima, Yokohama (JP); Atsuko Sakata, Yokohama (JP); Masayuki Kitamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 13/424,791

(22) Filed: Mar. 20, 2012

(65) Prior Publication Data

US 2013/0075912 A1 Mar. 28, 2013

(30) Foreign Application Priority Data

Sep. 22, 2011 (JP) ................................. 2011-207829

(51) Int. Cl.
*H01L 23/48* (2006.01)
*H01L 23/52* (2006.01)
*H01L 29/40* (2006.01)

(52) U.S. Cl.
USPC ............................. 257/774; 257/763; 257/764

(58) Field of Classification Search
None
See application file for complete search history.

(56) References Cited

U.S. PATENT DOCUMENTS

| 5,525,543 A * | 6/1996 | Chen ............................. 438/643 |
| 6,268,292 B1 * | 7/2001 | Violette et al. ................ 438/706 |
| 6,287,964 B1 * | 9/2001 | Cho ............................. 438/643 |
| 6,888,252 B2 * | 5/2005 | Derraa .......................... 257/774 |
| 7,592,256 B2 | 9/2009 | Okubo et al. |
| 2002/0000660 A1 * | 1/2002 | Sharan et al. ................. 257/751 |

FOREIGN PATENT DOCUMENTS

| JP | 2005-129831 | 5/2005 |
| JP | 2009-267309 | 11/2009 |

\* cited by examiner

*Primary Examiner* — Steven Loke
*Assistant Examiner* — Juanita B Rhodes
(74) *Attorney, Agent, or Firm* — Finnegan, Henderson, Farabow, Garrett & Dunner, L.L.P.

(57) ABSTRACT

According to one embodiment, a method for manufacturing a semiconductor device includes: forming a silicon oxide film on a semiconductor substrate; forming a via in the silicon oxide film; forming a contact layer inside the via; forming a silicon layer on the contact layer; and forming a tungsten film embedded in the via by making a tungsten-containing gas react with the silicon layer.

3 Claims, 23 Drawing Sheets

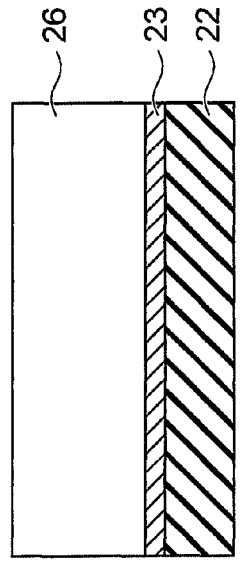
FIG. 6C
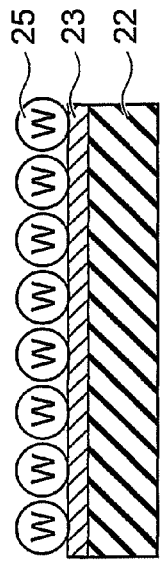
FIG. 6D
FIG. 6E
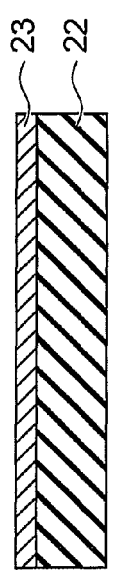
FIG. 6A
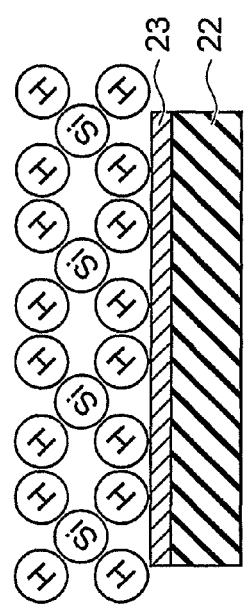
FIG. 6B

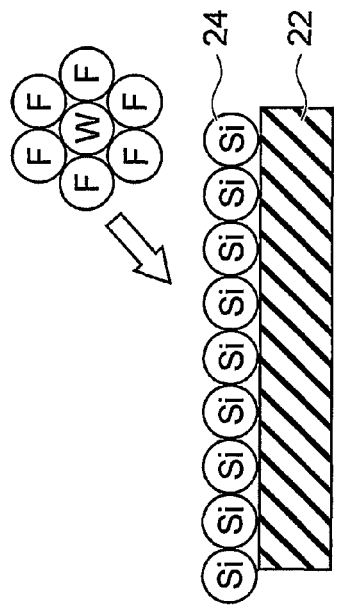
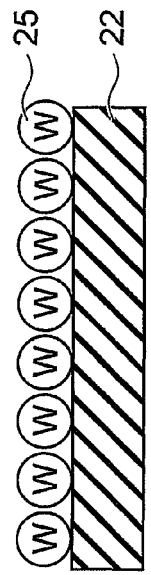
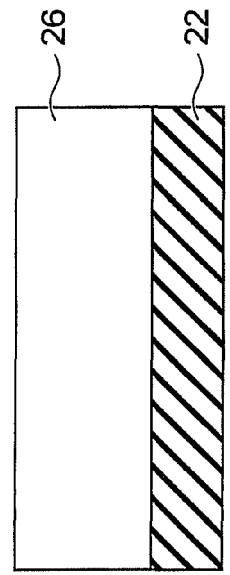
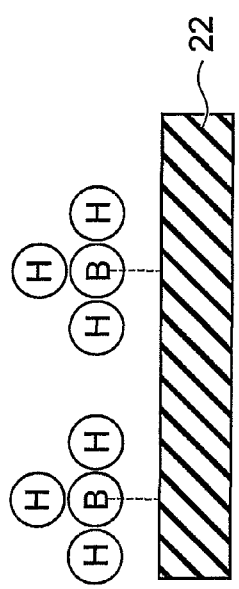
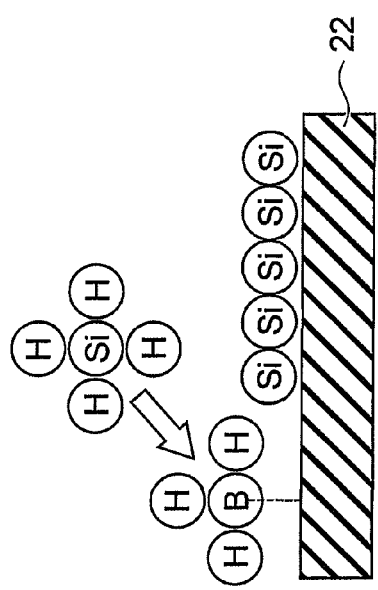

SEMICONDUCTOR DEVICE INCLUDING A PLUG AND METHOD FOR MANUFACTURING THE SAME

CROSS-REFERENCE TO RELATED APPLICATION

This application is based upon and claims the benefit of priority from prior Japanese Patent Application No. 2011-207829, filed on Sep. 22, 2011, the entire contents of which are incorporated herein by reference.

FIELD

Embodiments of the present invention relate to a semiconductor device and a method for manufacturing the same.

BACKGROUND

In a semiconductor device, a contact plug and/or a via plug are formed for interlayer connections between a semiconductor element and a wire, and between wires. The contact plug and the via plug are formed in such a manner as follows.

First, an element separation film and a semiconductor element are formed on a semiconductor substrate such as a silicon substrate, and an interlayer insulating film is further formed on the semiconductor element and the element separation film.

Next, the interlayer insulating film is selectively removed by means of mask patterning and etching, to form a via in the interlayer insulating film. Specifically, this formed via is a contact via for forming a contact plug to connect between a wire and a silicide layer on a diffusion layer and a gate electrode, or a plug via for forming a via plug to connect between a lower-layer wire and an upper-layer wire.

Then, a contact layer is formed on a side wall inside the via as thus formed for example by means of a PVD (Physical Vapor Deposition) technique. This contact layer has high adhesion both with a tungsten film and the interlayer insulating film, and is made of a titanium nitride film or the like, on which tungsten crystal nucleuses are apt to be generated as compared with on the interlayer insulating film. Further, the tungsten film is embedded into the via covered by the contact layer by means of a CVD (Chemical Vapor Deposition) technique. Thereafter, the contact layer and the tungsten film lying off the via are removed by means of a CMP (Chemical Mechanical Polishing) technique, to form the contact plug and the via plug.

As thus described, the tungsten film formed by means of the CVD technique has been long considered, and widely used to form plugs.

BRIEF DESCRIPTION OF THE DRAWINGS

FIGS. 6A to 6E are views for explaining a mechanism of a method for manufacturing a semiconductor device of a comparative example;

FIGS. 8A to 8F are views for explaining a mechanism of the method for manufacturing a semiconductor device according to the first embodiment;

DETAILED DESCRIPTION

In one embodiment, a method for manufacturing a semiconductor device includes: forming a silicon oxide film on a semiconductor substrate; forming a via in the silicon oxide film; forming a contact layer inside the via; forming a silicon layer on the contact layer; and forming a tungsten film embedded in the via by making a tungsten-containing gas react with the silicon layer.

Hereinafter, embodiments will be described with reference to the drawings. However, the present invention is not restricted to this embodiment. It is to be noted that a part in common throughout the drawings is provided with a common numeral, and a repeated description thereof will be omitted. Further, the drawings are schematic views for explaining the invention and promoting understanding thereof, and some places may each have a shape, a size, a ratio or the like which is different from that of an actual device, but these can be appropriately subjected to design changes in light of the following descriptions and known techniques.

First Embodiment

A method for manufacturing a semiconductor device according to the present embodiment will be described using FIGS. 1A to 1G. These FIGS. 1A to 1G show a manufacturing process for a plug 31, and correspond to a cross section of the plug 31 in the semiconductor device. It is to be noted that the present invention is not restricted to a plug in such a shape as hereinafter described, but can also be applied to a plug of another embodiment.

First, an element separation film (not shown) and a semiconductor element (not shown) are formed on a semiconductor substrate 1 such as a silicon substrate. Further, as shown in FIG. 1A, a silicon oxide film 2 having a thickness of, for example, 100 nm is formed as an interlayer insulating film on the semiconductor substrate 1. At this time, an interlayer insulating film having a multi-layered structure may be formed. Further, the silicon oxide film 2 is an insulating film containing oxide and silicon, and may contain carbon, hydrogen and the like.

Figure 1B:
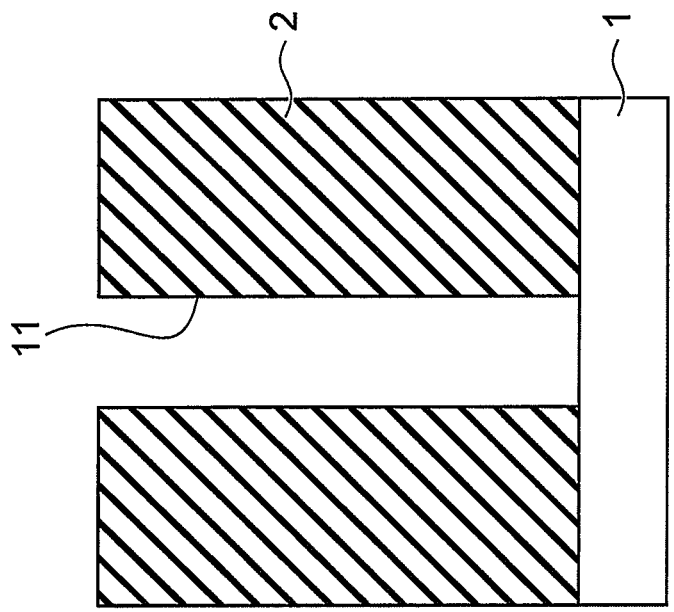
FIGS. 1A to 1G are sectional views for explaining a method for manufacturing a semiconductor device according to a first embodiment.
Figure 1A:
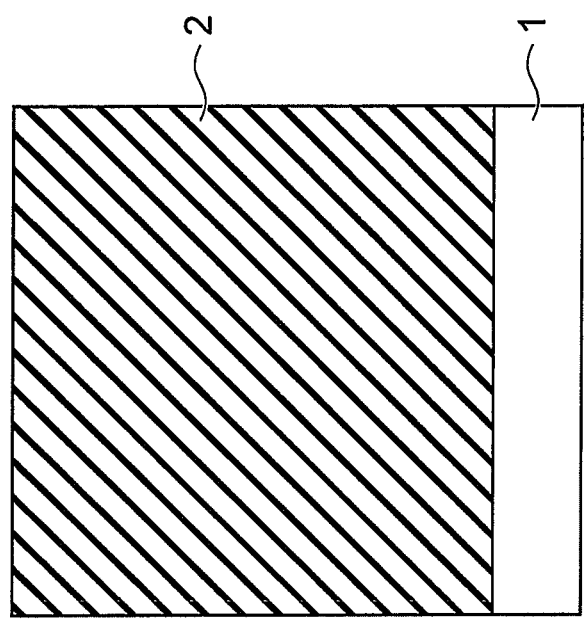

Next, as shown in FIG. 1B, the silicon oxide film 2 is selectively removed by means of mask patterning and etching such as RIE (Reactive Ion Etching), to form a via 11 in the silicon oxide film 2. For example, the via 11 has a via diameter of about 40 nm and a depth of 300 to 400 nm. That is, the via has an aspect ratio of not smaller than 7. It is to be noted that a contact layer (not shown) made of titanium or the like may be formed on the bottom of the via 11 for the purpose of further ensuring contact with a wiring layer (not shown) provided below the silicon oxide film 2.

Figure 1D:
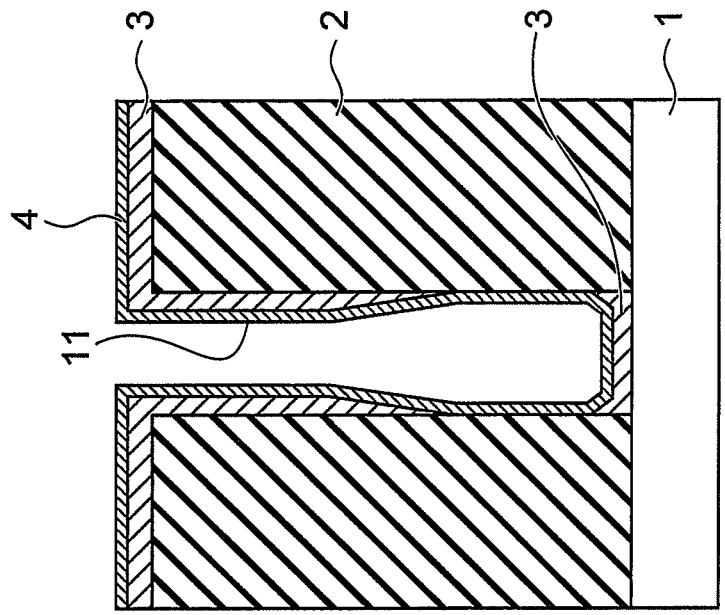
Figure 1C:
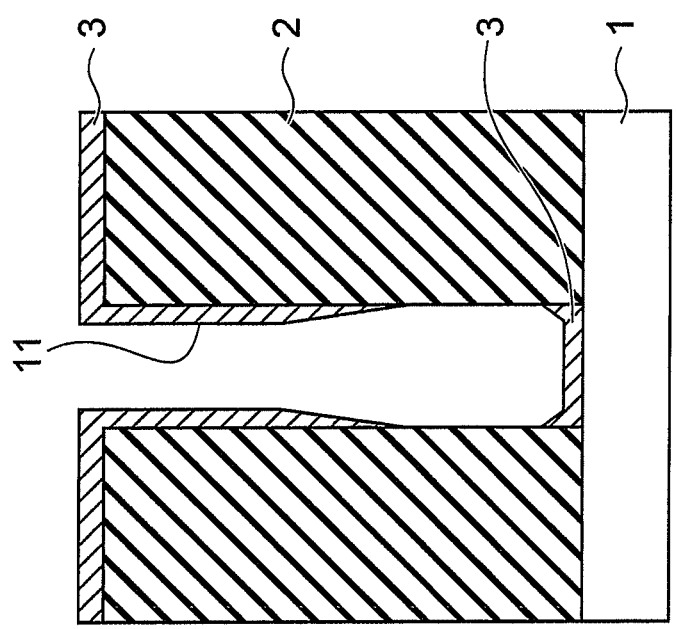

Then, as shown in FIG. 1C, a titanium nitride film as a contact layer 3 is formed on a side wall and the bottom inside the via 11, and on the surface of the silicon oxide film 2, by means of the PVD technique. It is to be noted that as the contact layer 3, there may be formed a titanium film, a tantalum film, a tantalum nitride film, a nitride tungsten film or the like. Further, although the contact layer 3 is preferably one covering across the side wall and the bottom of the via 11, as shown in FIG. 1C, it may be such a discontinuous one that the silicon oxide film 2 is exposed from the contact layer 3 inside the via 11.

Next, a thin silicon layer 4 is formed on the contact layer 3 inside the via 11. That is, in the present embodiment, in embedment of a tungsten film 6 by means of the CVD technique in accordance with the method that has hitherto been considered by the present inventors, the thin silicon layer 4 is formed in place of performing a process referred to as a "step of adsorbing a reductive gas". The method that has hitherto been considered by the present inventors will be described later.

Specifically, first, the semiconductor substrate 1 formed with the via 11 is arranged in a film formation chamber, and heated to 200 to 500° C.

Next, on a condition of 1 to 100000 Pa, a $B_2H_6$ gas of 10 to 2000 sccm is introduced into the film formation chamber, not followed by purging, and a $SiH_4$ gas of 100 to 2000 sccm and a $H_2$ gas of 100 to 2000 sccm are introduced into the film formation chamber, to form the silicon layer 4 in a conformal manner on the contact layer 3 inside the via 11 by means of the CVD technique, as shown in FIG. 1D. The silicon layer 4 is, for example, formed as one having a thickness in the order of 0.2 to 30 nm. However, this film thickness is not restrictive, but in a subsequent process, it is preferable to form the silicon layer 4 having such a film thickness that the tungsten film 6 can be sufficiently embedded into the via 11 and the silicon layer 4 does not remain between the contact layer 3 and the tungsten film 6 after formation of the plug 31. However, since the film thickness of the silicon layer 4, which is required to be consumed as a reduction/replacement film in a subsequent process, changes depending on film forming conditions for the tungsten film 6, it is not uniquely decided, and hence a film thickness in accordance with requirements is applied. In addition, this silicon layer 4 contains boron as well as silicon since the layer is formed using a $B_2H_6$ gas.

Accordingly, forming the silicon layer 4 by use of the $SiH_4$ gas and the $B_2H_6$ gas can lead to thermal decomposition of the $SiH_4$ gas at not higher than 370° C., thereby to form the silicon layer 4 even at a low temperature (this mechanism will be described later). However, when the formation at a low temperature is not required, there is no need for using the $B_2H_6$ gas, but a $Si_2H_6$ gas (having a thermal decomposition temperature in the vicinity of 400° C.) or a $SiH_4$ gas (having a thermal decomposition temperature in the vicinity of 600° C.) may be used to form the thin silicon layer 4. In such a case, the silicon layer 4 does not contain boron.

After formation of the silicon layer 4, the $B_2H_6$ gas and the $SiH_4$ gas are purged from the film formation chamber.

Then, the tungsten film 6 is formed so as to be embedded into the via 11 by means of the CVD method. That is, in the present embodiment, in embedment of a tungsten film 6 by means of the CVD technique in accordance with the method that has hitherto been considered by the present inventors, similar processes to processes referred to as a "step of generating tungsten crystal nucleuses 5" and a "step of depositing the tungsten film 6" are performed. In addition, the method that has hitherto been considered by the present inventors will be described later.

Figure 1F:
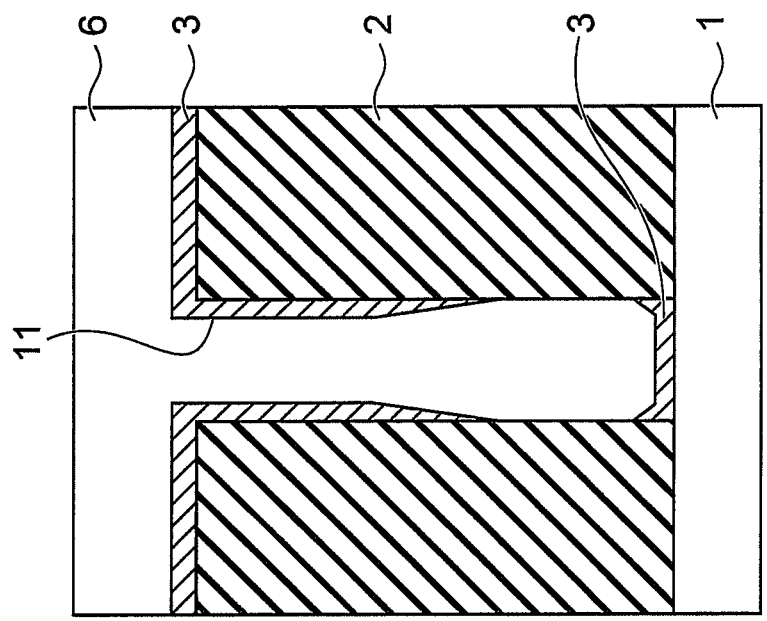
Figure 1E:
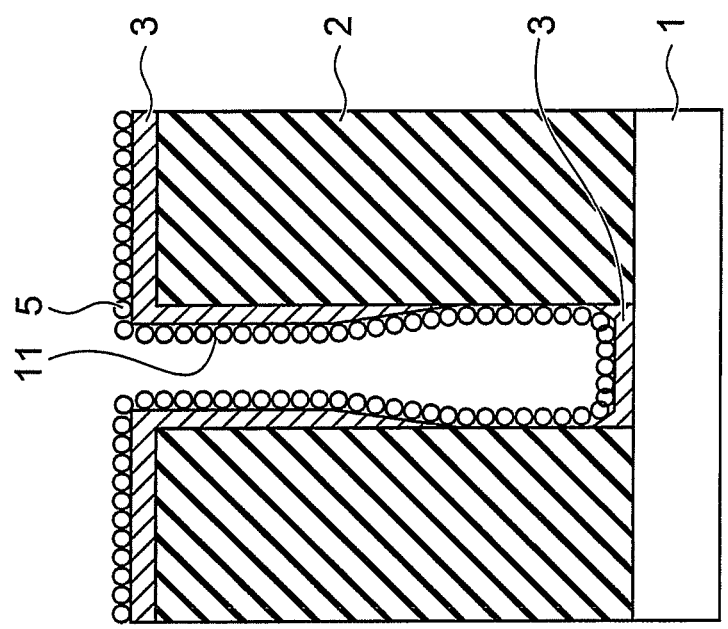

First, the "step of forming the tungsten crystal nucleuses 5" is performed. For example, on a condition of 1 to 100000 Pa, the $WF_6$ gas of 100 to 1000 sccm is introduced, and then replaced (reacted) with the silicon layer 4, to form the tungsten initial crystal nucleuses 5. Thereafter, the $WF_6$ gas inside the film formation chamber is once purged, the $SiH_4$ gas as a reductive gas is introduced into the chamber, and the $SiH_4$ gas is adsorbed onto the tungsten initial crystal nucleuses 5. Further, after purging of the $SiH_4$ gas, the $WF_6$ gas is introduced into the film formation chamber. A cycle of introduction and purging of the material gas and introduction of the reductive gas, as thus described, is repeated a plurality of times, e.g., twice to 15 times, and as shown in FIG. 1E, the $SiH_4$ gas is reacted with the absorbed $WF_6$ gas, to generate the tungsten initial crystal nucleuses 5 on the contact layer 3. The silicon layer 4 previously formed on the contact layer 3 is reacted so that the tungsten initial crystal nucleuses 5 can be generated in high density on the contact layer 3. At this time, the entire silicon layer 4 is preferably reacted with the $WF_6$ gas in order to avoid increases in resistance value of the plug 31 and interface resistance value. It is desirable to replace the silicon layer 4 located on the bottom of the via 11 by the tungsten initial crystal nucleuses 5 such that not less than one half of a contact area of the bottom of the via 11 is covered by the tungsten film 6, namely, on the bottom of the via 11, a joint surface between the tungsten film 6 and the contact layer 3 has an area not less than one half of the contact area of the bottom of the via 11.

When the tungsten initial crystal nucleuses 5 can be sufficiently formed by adjustment of the film thickness of the silicon layer 4, this "step of forming the tungsten crystal nucleuses 5" does not have to be performed.

Next, the "step of depositing the tungsten film 6" is performed. Next, on a condition of 1 to 100000 Pa, the $WF_6$ gas of 100 to 1000 sccm and the $H_2$ gas of 100 to 3000 sccm are introduced into the film formation chamber, to deposit the tungsten film 6 as shown in FIG. 1F.

It is to be noted that as the carrier gas in each step described so far, for example, an Ar gas of 100 to 10000 sccm or an $N_2$ gas of 100 to 1000 sccm can be used. Further, a process temperature for formation of the tungsten film 6 can be variably selectable from 200 to 500° C. Further, process temperatures in formation of the silicon layer 4, the "step of forming the tungsten initial crystal nucleuses 5" and the "step of depositing the tungsten film 6" may be the same or different, and are variously selectable in accordance with the purpose.

Figure 1G:
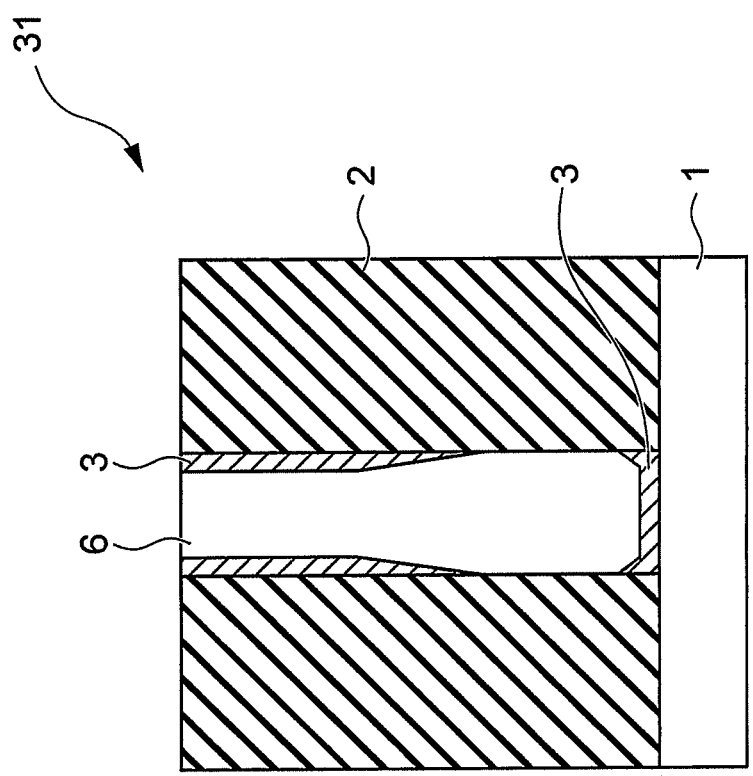

Next, as shown in FIG. 1G, the tungsten film 6 and the contact layer 3 protruding from the via 11 are polished and removed by means of CMP (Chemical Mechanical Polishing), to form the plug 31.

In addition, modified examples of the present embodiment may include one not formed with the contact layer 3 differently from the present embodiment described above.

Figure 2:
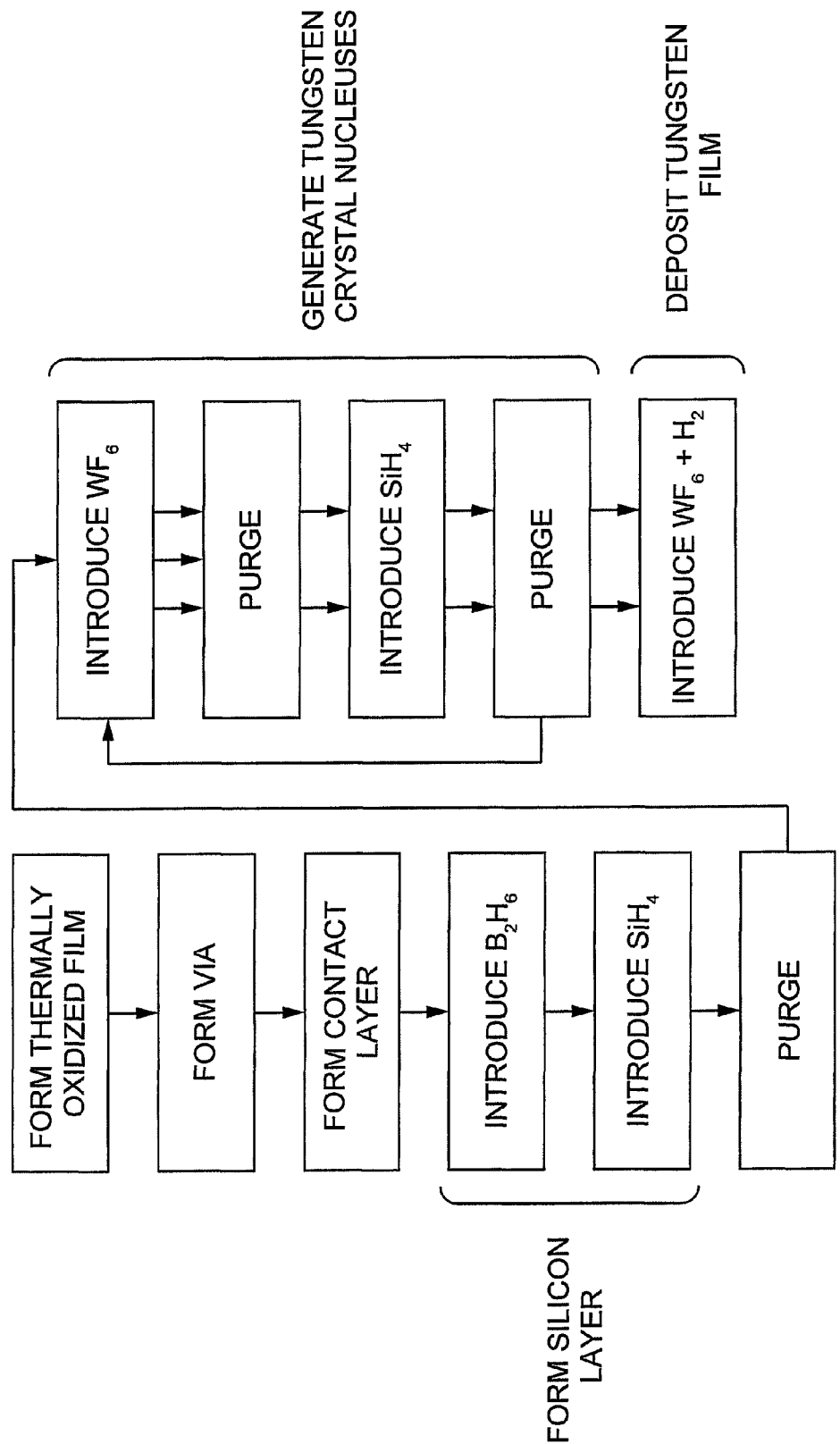
FIG. 2 is a diagram showing a flow of the method for manufacturing a semiconductor device according to the first embodiment.

FIG. 2 shows a flowchart of a method for manufacturing the plug 31 which has been described so far.

Figure 3:
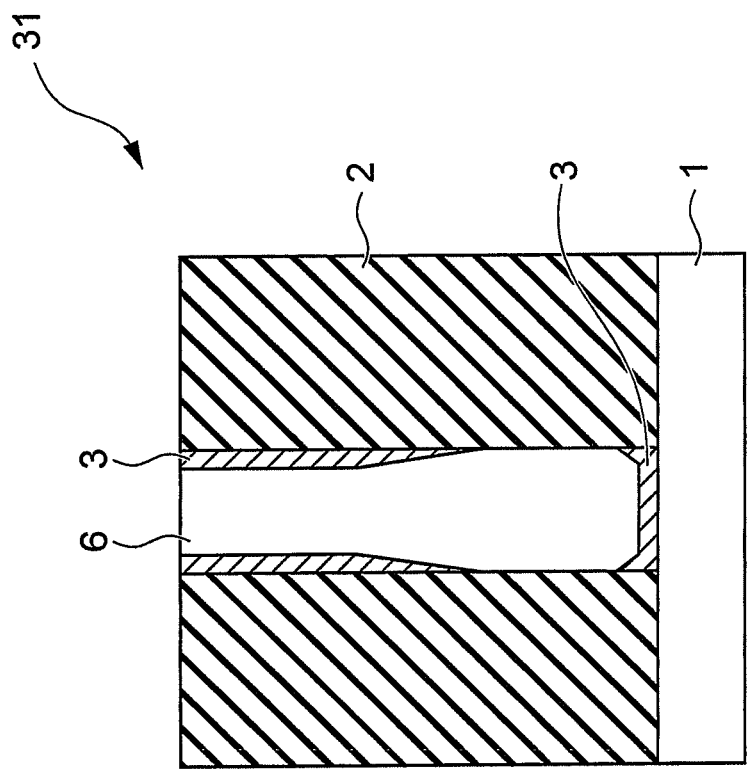
FIG. 3 is a sectional view of the semiconductor device according to the first embodiment.

The plug 31 formed as described above is shown in a cross section of FIG. 3, and more specifically, the plug 31 of the present embodiment includes: the via 11 provided in the silicon oxide film 2 formed on the semiconductor substrate 1; the contact layer 3 made up of the titanium nitride film and the like on the side wall and the bottom inside the via 11; and the tungsten film 6 embedded in the via 11. It is to be noted that the contact layer 3 is not restricted to the film that covers across the side wall and the bottom inside the via 11, but may be a discontinuous film that covers the side wall or the bottom inside the via 11, or covers part of these. Further, boron may be contained between the contact layer 3 and the tungsten film 6. Further, it is preferable that the silicon layer 4 formed before embedment of the tungsten film 6 be reacted with the $WF_6$ gas and not remain eventually on the contact layer 3, but part of the silicon layer 4 may remain on the contact layer 3. In this case, the film thickness of the silicon layer 4 is not larger than 30 nm.

Figure 4:
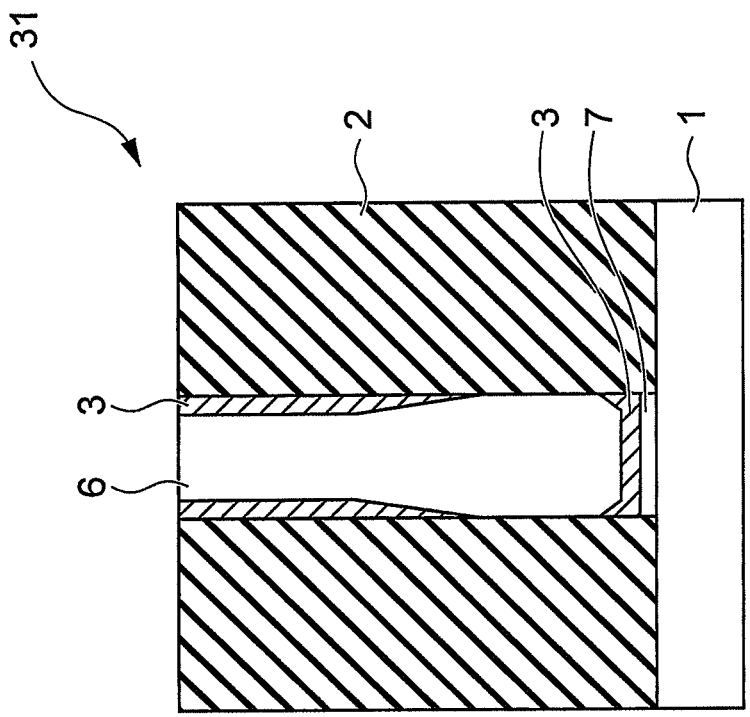
FIG. 4 is a sectional view of a semiconductor device according to a modified example of the first embodiment.

Further, in the plug 31, as shown in FIG. 4, the contact layer 7 made of titanium or the like may be formed on the bottom of the via 11 for the purpose of further ensuring contact with a wiring layer (not shown) provided below the silicon oxide film 2.

Figure 5:
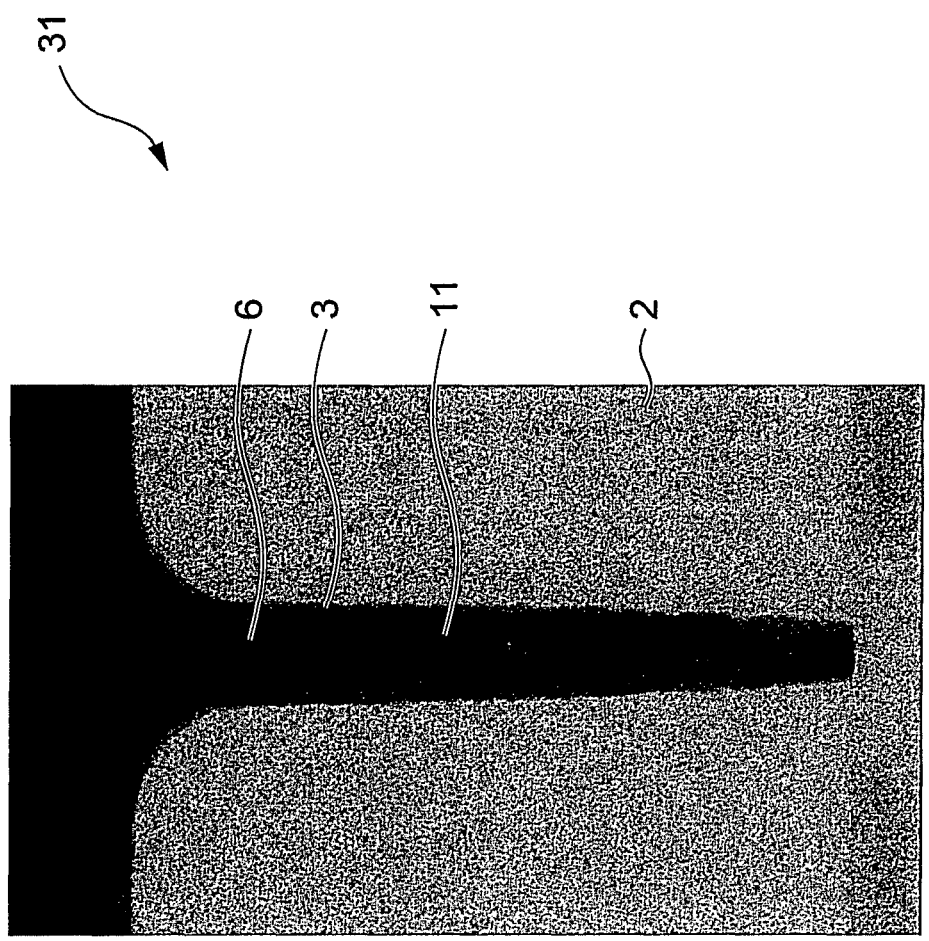
FIG. 5 is a micrograph of a cross section of the semiconductor device according to the first embodiment.

FIG. 5 shows a STEM (Scanning Transmission Electron Microscope) image of the cross section of the plug 31 as thus formed. As seen from FIG. 5, although a place is recognized where the silicon oxide film 2 is exposed from the contact layer 3 on the side wall of the via 11 due to a shortage of coverage of the contact layer 3 formed by means of the PVD technique, despite that, the entire via 11 is filled with the tungsten film 6.

In the present embodiment, for example, even when the contact layer 3 formed by means of the PVD technique is a discontinuous film and part of the silicon oxide film 2 is in the state of being exposed from the contact layer 3 due to the via 11 having a high aspect ratio, forming the silicon layer 4 inside the via 11 can lead to generation of the high-density tungsten initial crystal nucleuses 5 inside the via 11. It is therefore possible to embed the tungsten film 6 into the via 11 without generating an unfilled place inside the via 11. Further, in the present embodiment, since poor coverage of the contact layer 3 is acceptable, it is possible to form the contact layer 3 by means of the PVD technique, so as to reduce device cost and running cost. Further, since not requiring a high process temperature, the present embodiment is applicable to manufacturing of a variety of such semiconductor devices as requiring a low-temperature process.

Hereinafter, a formation mechanism for the tungsten film 6 of the present embodiment will be described. At this time, a description will be provided while a comparison is made with a formation mechanism for the tungsten film 6 by means of the method that has hitherto been considered by the present inventors as a comparative example. (Hereinafter, the "method that has hitherto been considered by the present inventors" is referred to as a "method of the comparative example".) First, a process mechanism for embedment of the tungsten film 6 by means of the CVD technique in the method of the comparative example will be described in detail, using FIGS. 6A to 6E. FIGS. 6A to 6E are views schematically showing a process of generating tungsten crystal nucleuses 25 on a titanium nitride film 23 as the contact layer 3 on a silicon oxide film 22. It is to be noted that embedment of the tungsten film by mean of the CVD method in the method of the comparative example is normally divided into the "step of adsorbing a reductive gas", the "step of forming the tungsten crystal nucleuses 5" and the "step of depositing the tungsten film 6".

First, as shown in FIG. 6A, the semiconductor substrate (not shown) formed with the silicon oxide film 22 and the titanium nitride film 23 as the contact layer 3 is heated to 250 to 500° C.

Next, as shown in FIG. 6B, the step of adsorbing a reductive gas is performed. Specifically, for example on condition of 1 to 100000 Pa, as the kind of reductive gas to be adsorbed, the $SiH_4$ gas of 100 to 2000 sccm is introduced as a mixture gas with the $H_2$ gas of 100 to 3000 sccm for the sake of total pressure adjustment and gas supply stabilization. Alternatively, in the case of selecting $B_2H_6$ as the kind of reductive gas to be adsorbed, the $B_2H_6$ gas of 100 to 2000 sccm is mixed with the $H_2$ gas of 100 to 3000 sccm for total pressure adjustment and gas supply stabilization, which is then introduced. Normally, the kind of reductive gas is adsorbed to the surface of the titanium nitride film 23 by either of the above methods. Since the thermal decomposition temperature of the $SiH_4$ gas is in the vicinity of 600° C., in a temperature range not reaching the thermal decomposition temperature in the vicinity of 600° C., e.g., the temperature range of 250 to 500° C. as shown in the present embodiment, the $SiH_4$ gas is not thermally decomposed to generate a silicon atom, but adsorbed to the titanium nitride film 23 while remaining to be the $SiH_4$ gas. In adsorption of the $SiH_4$ gas, the $SiH_4$ gas can be adsorbed in high density on the titanium nitride film 23 due to a difference in adsorption probability between the top of the silicon oxide film and the titanium nitride film. Alternatively, after adsorption of the $SiH_4$ gas, part of silicon atoms may be generated due to contribution of electrons of the titanium nitride film, thereby facilitating subsequent formation of the tungsten film 6. On the other hand, however, the $SiH_4$ gas has a low adsorption probability on the silicon oxide film, thereby not facilitating subsequent formation of the tungsten film 6. For this reason, in the case of poor and discontinuous converge of the titanium nitride film 23, the silicon oxide film 2 on a substrate is exposed, and the $SiH_4$ gas is insufficiently adsorbed to this exposed portion. Further, in the case of a reaction which is mainly adsorption of the $SiH_4$ gas, with a $SiH_4$ gas module having a size to a certain degree, the already adsorbed $SiH_4$ gas may disturb the reaction, to cause a decrease in adsorption probability of the $SiH_4$ gas as a whole.

Then, as shown in FIG. 6C, a "step of forming the tungsten crystal nucleuses 25" is performed. For example, similarly to the first embodiment of the present invention, the $WF_6$ gas is introduced as the material gas into the chamber. Then, the $WF_6$ gas inside the film formation chamber is once purged, and the $SiH_4$ gas or the $B_2H_6$ gas is introduced into the chamber. Further, after purging of the $SiH_4$ gas or the $B_2H_6$ gas, the $WF_6$ gas is introduced into the film formation chamber. As thus described, a cycle of introduction and purging of the material gas, introduction of the $SiH_4$ gas or the $B_2H_6$ gas and purging of the $SiH_4$ gas or the $B_2H_6$ gas as thus described is repeated a plurality of times, and as shown in FIG. 6D, the $SiH_4$ gas or the $B_2H_6$ gas which is adsorbed to the titanium nitride film 23 is reacted with the $WF_6$ gas, to generate the tungsten crystal nucleuses 25 on the titanium nitride film 23.

Next, as shown in FIG. 6E, a "step of depositing a tungsten film 26" is performed. For example, similarly to the first embodiment of the present invention, the $WF_6$ gas and the $H_2$ gas are introduced into the film formation chamber, to deposit the tungsten film 26 on the titanium nitride film 23.

However, in recent years, in the plug 31, as a design rule of the semiconductor device is becoming finer, a ratio of a height of the plug 31 (depth of the via 11) to a size of an opening of the via 11 tends to become higher, namely, the via 11 tends to have a higher aspect ratio. Then, it is becoming difficult to form the contact layer 3 inside the via 11 having a high aspect ratio so as to cover across the inside of the via 11 when the contact layer 3 is to be formed by means of the PVD technique.

Further, the $SiH_4$ gas for use in embedment of the tungsten film 6 is apt to be adsorbed to the contact layer 3 made of titanium nitride, but is on the other hand not apt to be adsorbed onto the silicon oxide film 2 as the interlayer insulating film.

Figure 7A:
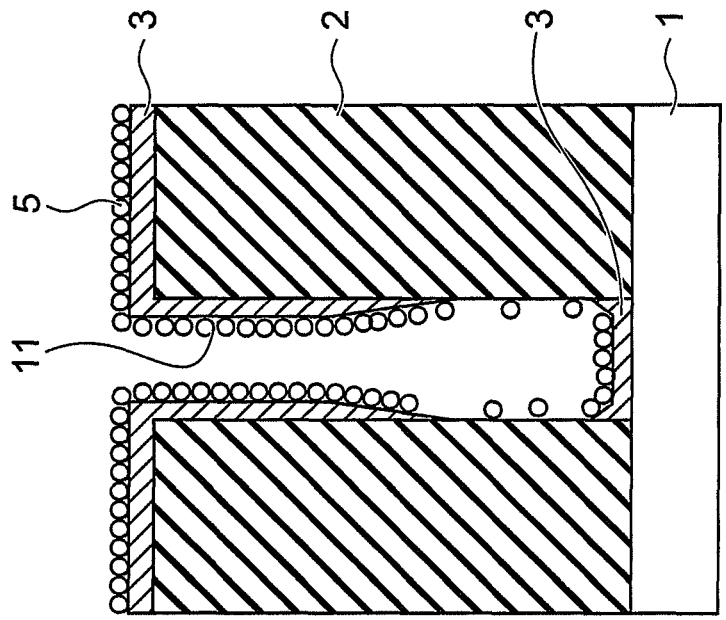
FIGS. 7A to 7C are sectional views for explaining the method for manufacturing a semiconductor device of the comparative example.
Figure 7B:
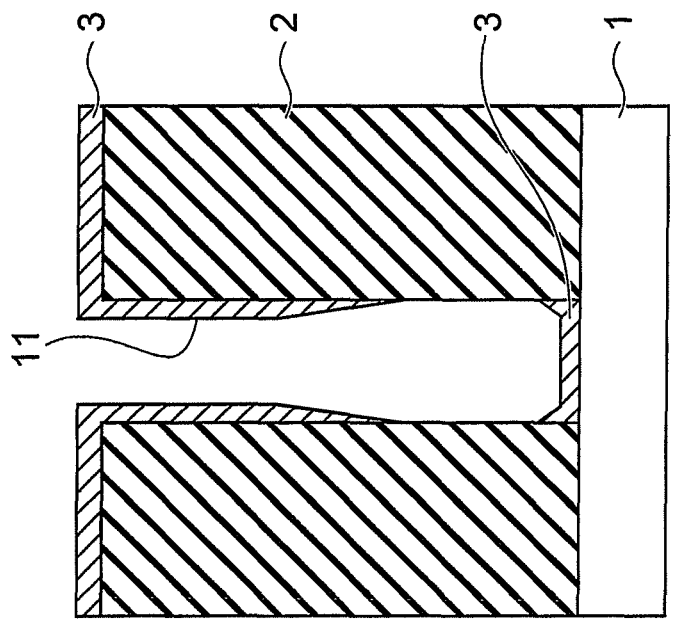
Figure 7C:
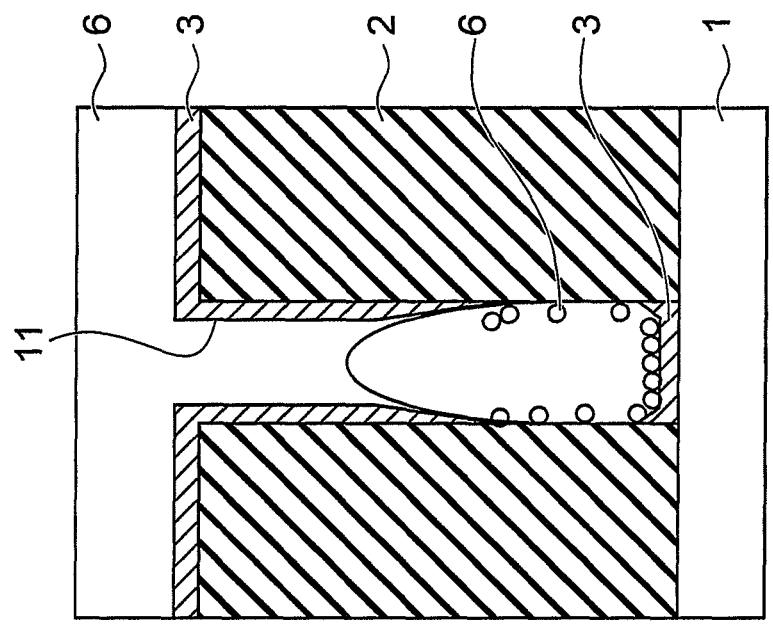

Therefore, in the comparative example, a problem as below is to occur. This problem will be described using FIGS. 7A to 7C showing a manufacturing process for the plug 31 according to the method of the comparative example. First, as described above, due to a shortage of coverage in the contact layer 3 formed by means of the PVD technique, part of the silicon oxide film 2 is exposed from the contact layer 3 as shown in FIG. 7A. In such a case, there occurs a shortage of the $SiH_4$ gas on the exposed silicon oxide film 2, the tungsten crystal nucleuses 5 are difficult to generate on the exposed silicon oxide film 2, as shown in FIG. 7B. Accordingly, with the tungsten crystal nucleuses 5 being not sufficiently generated, the tungsten film 6 is difficult to form on the exposed silicon oxide film 2 in a subsequent process, and as shown in FIG. 7C, a place not filled with the tungsten film 6 exists in part of the via 11. That is, in the comparative method, there occurs a problem of the via 11 being defective in embedment.

Thereat, in order to solve the shortage of coverage in the contact layer 3, there has been considered a method for forming the contact layer 3 by means of the CVD technique in place of the PVD technique. Forming the contact layer 3 by means of the CVD technique can lead to improvement in coverage of the contact layer 3 even with respect to the via 11 having a high aspect ratio, thereby to form the plug 31 such that the entire via 11 is filled with the tungsten film 6. However, the process temperature is high at the time of forming the contact layer 3 by means of the CVD technique, for example in the case of using a $TiCl_4$ source and forming the contact layer 3 made of titanium nitride by means of the CVD technique since a thermal decomposition temperature of a $TiCl_4$ gas as a material gas is in the vicinity of 640° C. Therefore, with recent diversification of semiconductor elements, it is difficult to apply such formation of the contact layer 3 by means of the CVD technique as thus described to manufacturing of the semiconductor device having a semiconductor element and the like required to be formed in a low-temperature range. Further, although there is a method of forming the contact layer 3 by means of a low-temperature MOCVD (Metal Organic Chemical Vapor Deposition) technique, this method requires plasma processing and the like in order to obtain a metallic, low resistive contact layer 3. When a film quality is improved using normal plasma processing, film formation/deposition of the contact layer 3 shrinks so that metallic characteristics can be obtained. This plasma processing sufficiently functions on the contact layer 3 formed on a field surface such as the surface of the silicon oxide film 2 and on the bottom of the via 11, to allow improvement in film quality, but does not effectively function in terms of improvement in film quality of the contact layer 3 formed on the side wall of the via 11. Therefore, since the plasma processing does not effectively act on the contact layer 3 formed on the side wall of the via 11, and since the problem of the plasma processing being less able to sufficiently function with the finer via becomes more apparent, a high resistive contact layer 3 in a thick film state, formed by means of the MOCVD technique, remains on the side wall of the via 11 as it is. This causes the plug 31 to become more highly resistive, and hence it cannot necessarily be said that the above method is an optimal one. Further, the CVD technique also has the problem of the device cost and operation cost being high as compared with those in the PVD technique.

Next, a process mechanism for embedment of the tungsten film 6 by means of the CVD technique in the present embodiment will be described in detail, using FIGS. 8A to 8F. FIGS. 8A to 8F are views schematically showing a process of generating the tungsten crystal nucleuses 5 on the silicon oxide film 2 as the interlayer insulating film.

First, as shown in FIG. 8A, the semiconductor substrate (not shown) formed with the silicon oxide film 22 is arranged inside the film formation chamber and, for example, heated to 200 to 500° C.

Next, the $B_2H_6$ gas is introduced, to be adsorbed to the silicon oxide film 22. Specifically, as shown in FIG. 8B, the $B_2H_6$ gas is thermally decomposed to $BH_3$ inside a vapor phase of the film formation chamber or on the silicon oxide film 2, which is then adsorbed to the silicon oxide film 22.

Then, differently from the method of the comparative example, the introduced $B_2H_6$ gas is not purged, and the $SiH_4$ gas is successively introduced, as shown in FIG. 8C. As described above, since the thermal decomposition temperature of the $SiH_4$ gas is in the vicinity of 600° C., the gas is not thermally decomposed to generate silicon atoms at a temperature not reaching the above thermal decomposition temperature, but in the present embodiment, $BH_3$ exists on the silicon oxide film 22 and that $BH_3$ functions as a catalyst, and hence the $SiH_4$ gas is thermally decomposed to generate silicon atoms. Accordingly, a thin silicon layer 24 can be uniformly formed as shown in FIG. 8D even at such a low temperature as not higher than 370° C. Further, since this thermal decomposition reaction is a non-equilibrium reaction, extending the formation time for the silicon layer 24 can lead to formation of the silicon layer 24 made up of higher-density silicon atoms. Further, since the deposited silicon atoms move to a more stable place in terms of energy, such as a kink or a step on the bottom and the side wall of the via 11, to form a silicon-silicon band so that the silicon layer 24 made up of higher-density silicon atoms can be formed.

Next, as shown in FIG. 8E, the "step of forming the tungsten crystal nucleuses 25" is performed. Similarly to the method of the comparative example, a successive cycle of introduction and subsequent purging of the $SiH_4$ gas and introduction and subsequent purging of the $WF_6$ gas is repeated. At this time, this silicon layer 24 brings about a reductive reaction with the $WF_6$ gas, and silicon is replaced by tungsten, to generate the tungsten crystal nucleuses 25 in high density on the silicon oxide film 22.

Then, similarly to the method of the comparative example, as shown in FIG. 8F, the "step of depositing the tungsten film 26" is performed. At this time, with the tungsten crystal nucleuses 25 existing in high density, the number of contact points at which the tungsten film 26 is in contact with the silicon oxide film 22 increases, and it is thus possible to form the tungsten film 26 having a high adhesion with the silicon oxide film 22.

That is, differently from the method of the comparative example, in the present embodiment, even when there is a shortage of coverage of the contact layer 3 formed by means of the PVD technique due to the via 11 becoming finer, forming the silicon layer 4 can lead to generation of the high-density tungsten initial crystal nucleuses 5 inside the via 11. It is therefore possible to avoid generation of an unfilled place inside the via 11 and fill the via 11 with the tungsten film 6. Further, in the present embodiment, since poor coverage of the contact layer 3 is acceptable, it is possible to form the contact layer 3 by means of the PVD technique, so as to reduce device cost and running cost as compared with the case of using the CVD technique. Moreover, since not requiring a high process temperature, the present embodiment is applicable to manufacturing of a variety of such semiconductor devices as requiring a low-temperature process.

Furthermore, in the present embodiment, as the method for forming the silicon layer 4, the $B_2H_6$ gas is introduced into the film formation chamber, not followed by purging, and the $SiH_4$ gas and the $H_2$ gas are introduced. By introducing the $B_2H_6$ gas and then introducing the $SiH_4$ gas as thus described, the silicon layer 4 with a high boron concentration can be formed on the semiconductor substrate 1 side at the time of initial formation of the silicon layer 4, and a silicon layer with a high silicon concentration can then be formed on the upper layer side of the silicon layer 4. Therefore, according to the present embodiment, since silicon required for generation of the tungsten crystal nucleuses 5 can be made to exist in higher concentration on the surface layer, and it is possible to more efficiently generate the tungsten crystal nucleuses 5 in a subsequent process.

Next, for the purpose of investigating the effect of the present embodiment, samples as described below were created, the surfaces thereof were observed with Scanning Electron Microscope (SEM), and from SEM images thereby obtained, a density of the tungsten initial crystal nucleuses 5 on each surface was measured.

Similarly to the manufacturing method of the present embodiment, a sample A is obtained as follows. The silicon oxide film 2 having a thickness of 100 nm is formed on the semiconductor substrate 1, the silicon layer 4 is formed thereon, and a successive cycle of the "step of forming the tungsten crystal nucleuses 5" is performed twice. Similarly to the method of the comparative example described above, a sample B is obtained as follows. The silicon oxide film 2 having a thickness of 100 nm is formed on the semiconductor substrate 1, the "step of adsorbing a reductive gas" is performed, and a successive cycle of the "step of forming the tungsten crystal nucleuses" is performed twice.

Figure 9:
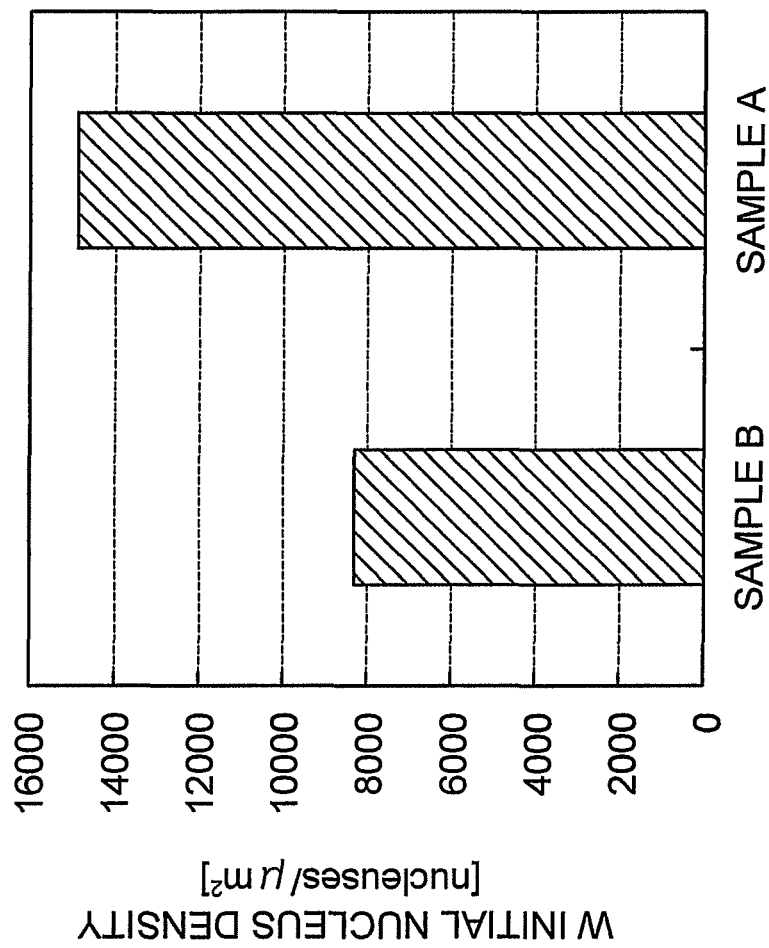
FIG. 9 is a diagram comparing densities of tungsten crystal nucleus.

The surface of each sample was observed with the SEM, and from the obtained SEM image, the density of the tungsten initial crystal nucleuses 5 on each surface was measured. According to FIG. 9 showing a result thereof, the density of the tungsten crystal nucleuses 5 of the sample A corresponding to the present embodiment was 14890 nucleuses/$\mu m^2$, and the density of the tungsten crystal nucleuses 5 of the sample B was 8330 nucleuses/$\mu m^2$.

That is, it was clarified that forming the silicon layer 4 according to the present embodiment can lead to formation of the tungsten crystal nucleuses 5 with higher density on the silicon oxide film 2.

Moreover, the present inventors performed specific analysis, to clarify the relation between the density of the tungsten crystal nucleuses 5 and the embedded state of the tungsten film 6 in the via 11 so as to make certain the effect of the present embodiment. A result of this is shown in FIG. 10.

Figure 10:
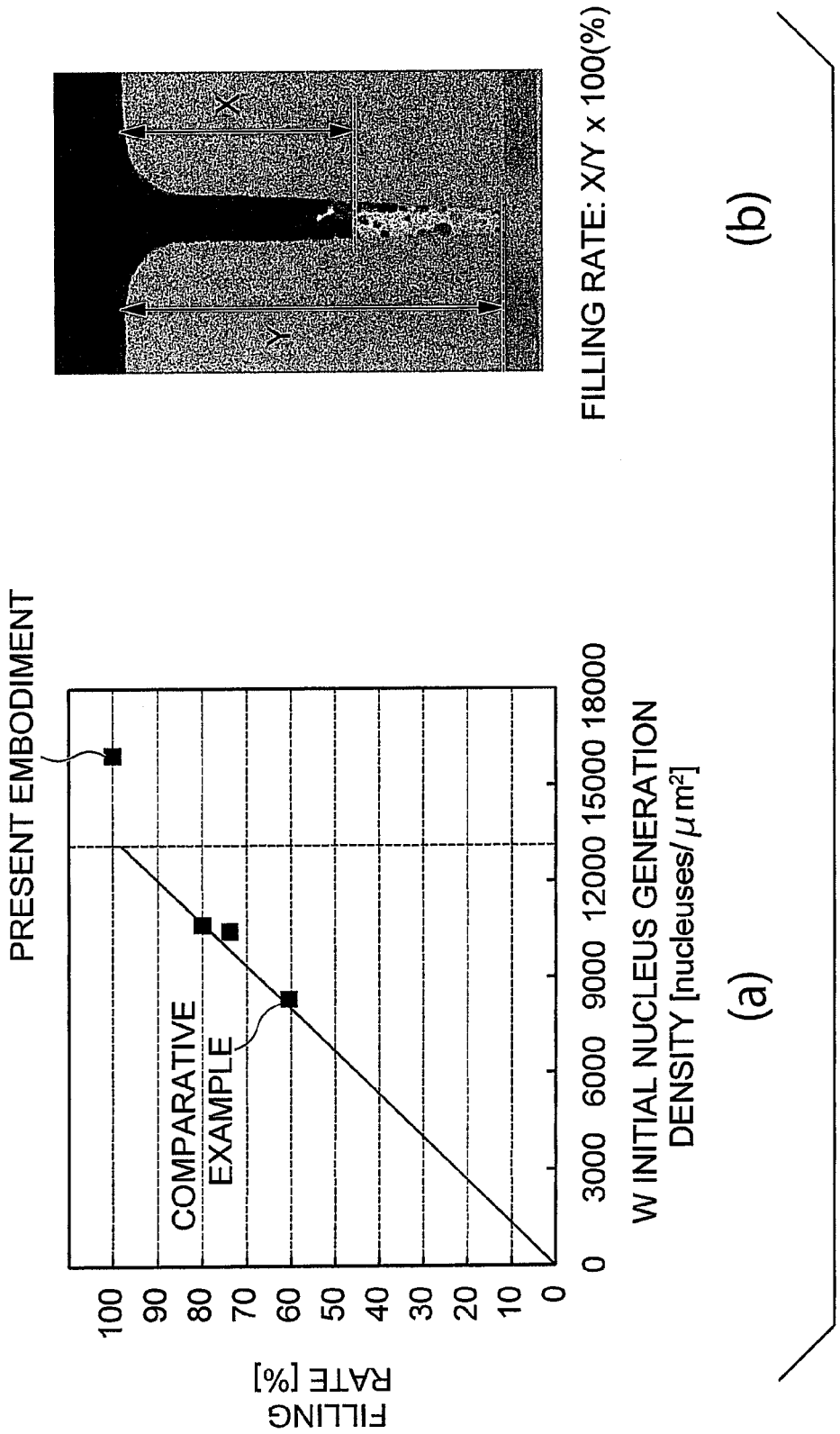
FIG. 10 is a diagram showing a correlation between a density of tungsten crystal nucleus and a degree of embedment of the via, and a micrograph of a cross section of the via.

Specifically, a lateral axis of FIG. 10($a$) shows a density of the tungsten crystal nucleuses 5, and a vertical axis thereof shows an embedment level of the tungsten film 6 (filling rate) in the via 11. This embedment level refers to a rate (filling rate) (X/Y) of a height (Y) of the via 11 to a height (X) of the embedded tungsten film 6 from the opening of the via 11 to the bottom of the via 11, as shown in FIG. 10($b$). As shown in FIG. 10($a$), there is a certain correlation between the density of the tungsten crystal nucleuses 5 and the embedment level of the tungsten film 6. It is found that, with increase in density of the tungsten crystal nucleuses 5, a value showing the embedment level of the tungsten film 6 increases, and the via 11 is filled with the tungsten film 6. Further, it can be predicted from this FIG. 10($a$) that, when the density of the tungsten crystal nucleuses 5 is not lower than about 12500 nucleuses/$\mu m^2$, the tungsten crystal nucleuses 5 can completely fill the via 11. Further, it is considered that such a predicted range of densities with which the via 11 can be completely filled with the tungsten film 6 is difficult to realize in the case of using the method of the comparative example as described above, but on the other hand can be realized in the case of using the present embodiment.

That is, it was found from the above result that the higher the density of the tungsten crystal nucleuses 5, the more the via 11 is filled with the tungsten film 6. Therefore, according to the present embodiment, it is possible to generate the high-density tungsten crystal nucleuses 5, so as to avoid generation of an unfilled place inside the via 11 and embed the tungsten film 6 into the via 11.

Second Embodiment

In the first embodiment, at the time of performing the method for forming the silicon layer 4, the $B_2H_6$ gas was introduced, not followed by purging, and the $SiH_4$ gas was introduced, thereby to make silicon, which is required for generation of the tungsten crystal nucleuses 5, exist in higher concentration on the surface layer, and in the subsequent process, the tungsten crystal nucleuses 5 was efficiently generated. On the other hand, in the present embodiment, a successive cycle of introduction and subsequent purging of the $B_2H_6$ gas and introduction and subsequent purging of the $WF_6$ gas is repeated a plurality of times. That is, successive introduction and purging of these gases are repeated, to form the silicon layer 4 and generate the tungsten crystal nucleuses 5. In such a manner, even with a raised film formation temperature, the silicon layer 4 with good coverage can be formed, and further, the higher-density tungsten initial crystal nucleus 5 can be generated inside the via 11.

Hereinafter, the present embodiment will be described. Although the manufacturing process for the plug 31 will hereinafter be described as an example, the present invention is not restricted to a plug in such a shape as hereinafter described. Further, the manufacturing process of the present embodiment is represented in FIG. 1A to FIG. 1G which were used in the description of the first embodiment, and herein, a portion in common with the first embodiment will be omitted.

Similarly to the first embodiment, the silicon oxide film 2 is formed on the semiconductor substrate 1 as shown in FIG. 1A, and the via 11 is formed on this silicon oxide film 2 as shown in FIG. 1B. Then, as shown in FIG. 1C, a titanium nitride film as the contact layer 3 is formed on the inside of the via 11 and on the surface of the silicon oxide film 2 by means of the PVD technique. Further, the semiconductor substrate 1 formed with the contact layer 3 is arranged in the film formation chamber, and then heated to a desired temperature, e.g., 410° C.

Next, for example on a condition of 1 to 100000 Pa, the $B_2H_6$ gas of 10 to 2000 sccm is introduced into the film formation chamber and then purged once, and the $SiH_4$ gas of 100 to 2000 sccm and the $H_2$ gas of 100 to 2000 sccm are introduced into the film formation chamber, and further purged. Next, for example on a condition of 1 to 100000 Pa, the WF$_6$ gas of 10 to 1000 sccm is introduced and then purged. Such a successive cycle is repeated a plurality of times, to form the silicon layer 4 and generate the tungsten crystal nucleuses 5.

Further, similarly to the first embodiment, the "step of depositing the tungsten film 6" is performed. Next, for example on a condition of 1 to 100000 Pa, the WF$_6$ gas of 100 to 1000 sccm and the H$_2$ gas of 100 to 3000 sccm are introduced into the film formation chamber, to deposit the tungsten film 6 as shown in FIG. 1E. Since a subsequent process is shown in FIGS. 1F and 1G and similar to the first embodiment, a description thereof will be omitted here.

Figure 11:
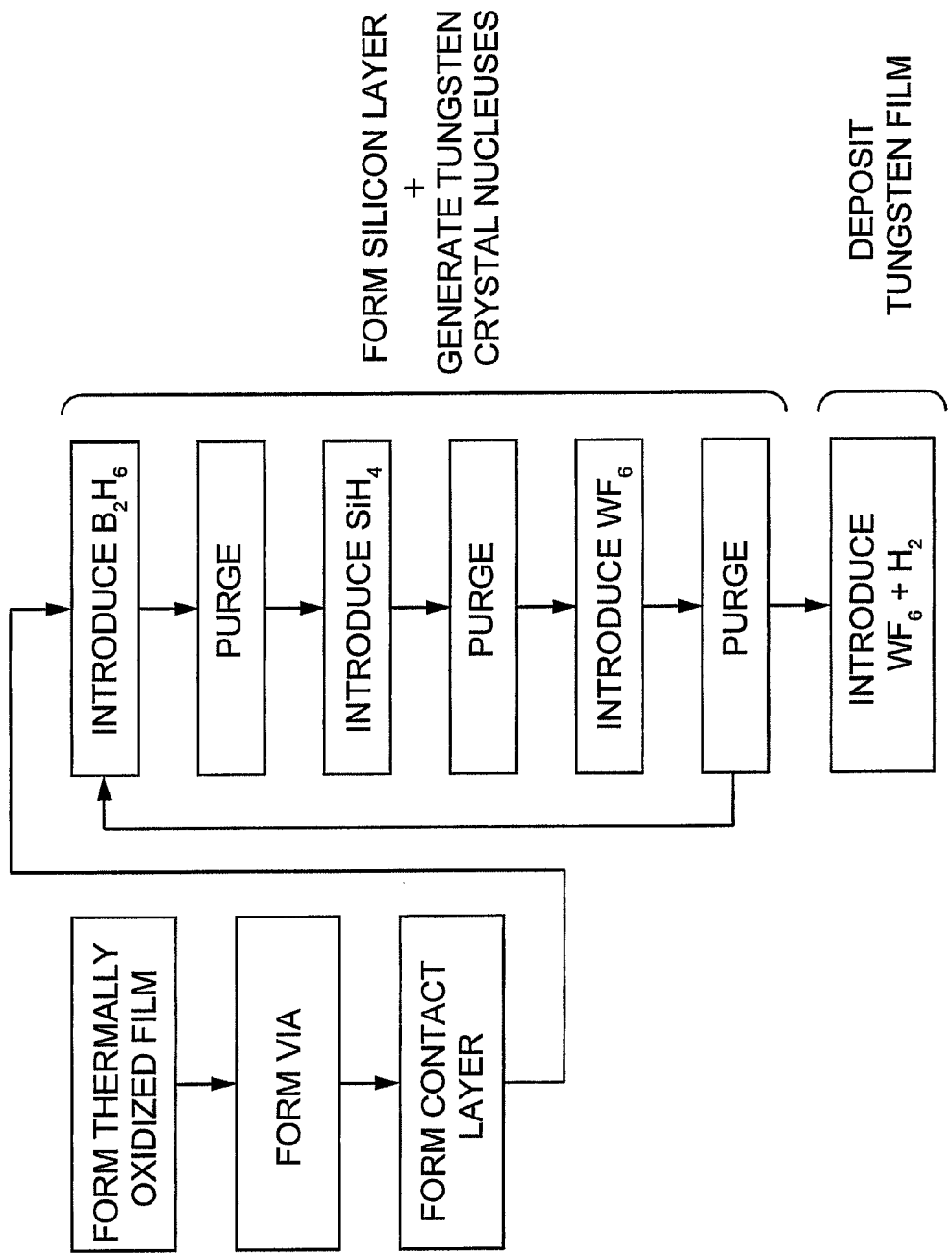
FIG. 11 is a diagram showing a flow of a method for manufacturing a semiconductor device according to the second embodiment.

FIG. 11 shows a flowchart of a method for manufacturing the plug 31 of the present embodiment.

In the present embodiment, the B$_2$H$_6$ gas was introduced and purged, and the SiH$_4$ gas was then introduced, and the SiH$_4$ gas is then introduced, whereby the SiH$_4$ gas is reacted mainly with the B$_2$H$_6$ gas alone which is adsorbed inside the via 11, to allow formation of the silicon layer 4. In such a manner, even with a raised film formation temperature, the silicon layer 4 with good coverage is formed, and the higher-density tungsten initial crystal nucleus 5 can further be generated inside the via 11.

It is to be noted that in the case of the film formation temperature being low (e.g., less than or equal to 350° C.), when the B$_2$H$_6$ gas is introduced and purged and the SiH$_4$ gas is then introduced, an adsorption amount of the B$_2$H$_6$ gas adsorbed inside the via 11 is small, and hence a rate of the reaction between the B$_2$H$_6$ gas and the SiH$_4$ gas decreases, to cause extended film formation time for the silicon layer 4. Therefore, when the film formation temperature is low, the first embodiment is desirably performed from the viewpoint of the productivity. On the other hand, in the case of the film formation temperature being high (e.g., more than 350° C.), when the B$_2$H$_6$ gas is mixed with the SiH$_4$ gas in the film formation chamber as in the first embodiment, a rate of the reaction between the B$_2$H$_6$ gas and the SiH$_4$ gas increases, to cause consumption of the B$_2$H$_6$ gas and the SiH$_4$ gas before reaching the bottom of the via 11. Therefore, the coverage of the silicon layer 4 formed inside the via 11 may deteriorate. Therefore, in order to avoid such a case, when the film formation temperature is high, the second embodiment is desirably performed from the viewpoint of coverage.

Third Embodiment

In the first embodiment, at the time of performing the method for forming the silicon layer 4, the B$_2$H$_6$ gas was introduced, not followed by purging and the SiH$_4$ gas was introduced, thereby to make silicon, which is required for generation of the tungsten crystal nucleuses 5, exist in higher concentration on the surface layer, and in the subsequent process, the tungsten crystal nucleuses 5 was efficiently generated. On the other hand, it is also necessary to accurately control the film thickness of the silicon layer 4 in order to form a desired plug 31, and as one of methods therefor, the present embodiment can be cited where, differently from the first embodiment, the B$_2$H$_6$ gas and the SiH$_4$ gas are simultaneously introduced into the film formation chamber, to form the silicon layer 4.

Hereinafter, the present embodiment will be described. Although the manufacturing process for the plug 31 will hereinafter be described as an example, the present invention is not restricted to a plug in such a shape as hereinafter described. Further, the manufacturing process of the present embodiment is represented in FIG. 1A to FIG. 1G which were used in the description of the first embodiment, and herein, a description of a portion in common with the first embodiment will be omitted.

Similarly to the first embodiment, the silicon oxide film 2 is formed on the semiconductor substrate 1 as shown in FIG. 1A, and the via 11 is formed on this silicon oxide film 2 as shown in FIG. 1B. Then, as shown in FIG. 1C, a titanium nitride film as the contact layer 3 is formed on the inside of the via 11 and on the surface of the silicon oxide film 2 by means of the PVD technique. Further, the semiconductor substrate 1 formed with the contact layer 3 is arranged in the film formation chamber, and then heated to a desired temperature, e.g., 300° C.

Next, on a condition of 1 to 100000 Pa, the SiH$_4$ gas of 100 to 2000 sccm and the B$_2$H$_6$ gas of 10 to 2000 sccm are simultaneously introduced into the film formation chamber, to form the silicon layer 4 inside the via 11 by means of the CVD technique, as shown in FIG. 1D. At this time, controlling the flow ratio between the B$_2$H$_6$ gas and the SiH$_4$ gas can lead to control of the film formation rate of the silicon layer 4, so as to accurately form the silicon layer 4 having a desired film thickness. Further, the silicon concentration of the silicon layer 4 can be controlled. Since a subsequent process is shown in FIGS. 1E and 1G and similar to the first embodiment, a description thereof will be omitted here.

Figure 12:
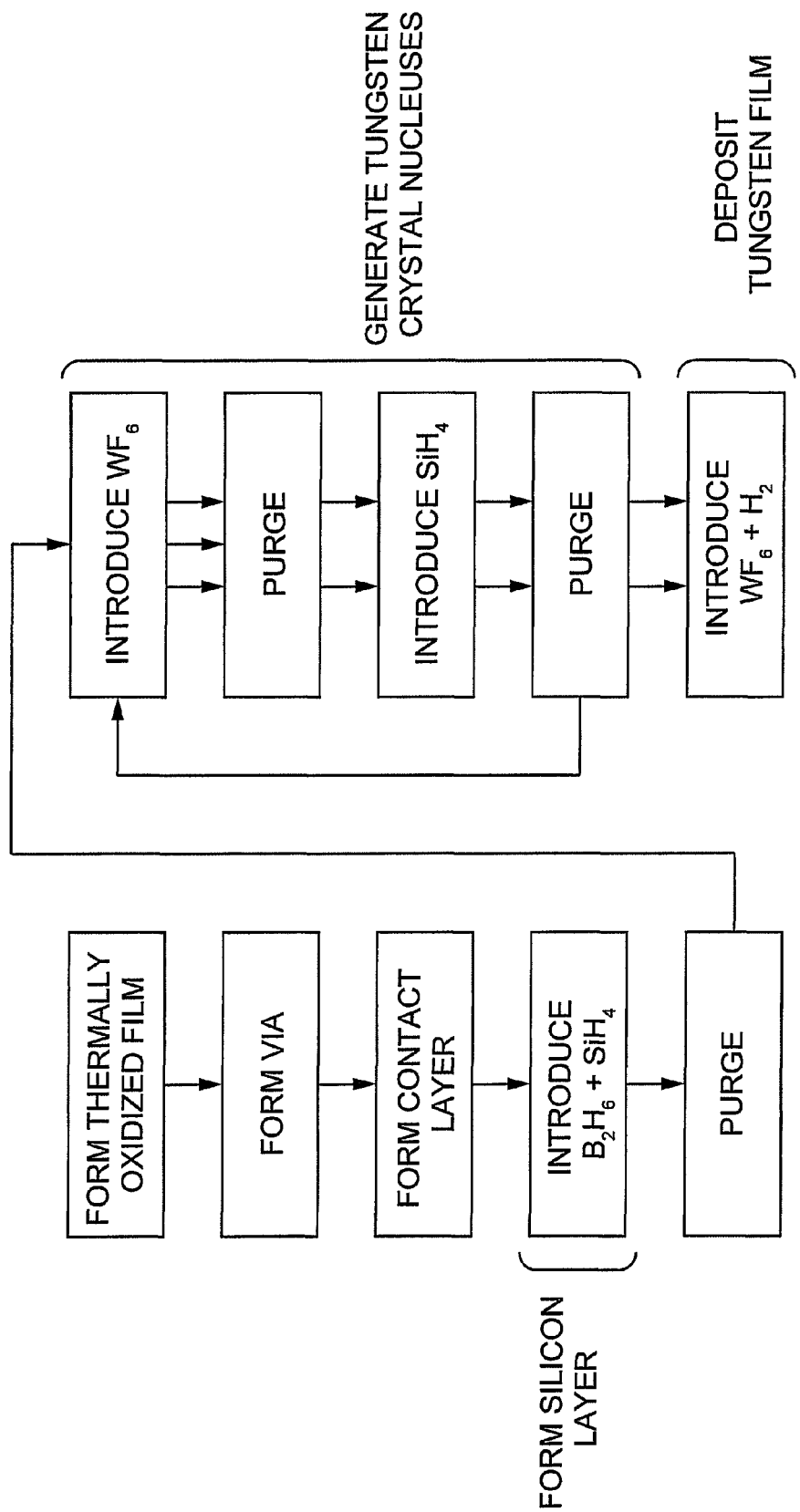
FIG. 12 is a diagram showing a flow of the method for manufacturing a semiconductor device according to a third embodiment.

FIG. 12 shows a flowchart of a method for manufacturing the plug 31 of the present embodiment.

According to the present embodiment, controlling the flow ratio between the B$_2$H$_6$ gas and the SiH$_4$ gas can lead to control of the film formation rate of the silicon layer 4, so as to accurately form the silicon layer 4 having a desired film thickness. This can further control the silicon concentration in the silicon layer 4 for efficient generation of the tungsten crystal nucleuses 5. It is thereby possible to control the density of the tungsten crystal nucleuses 5 generated in a subsequent process.

Hereinafter, a boron concentration in the silicon layer 4 in the case of changing the flow ratio between the B$_2$H$_6$ gas and the SiH$_4$ gas will be described.

Figure 13:
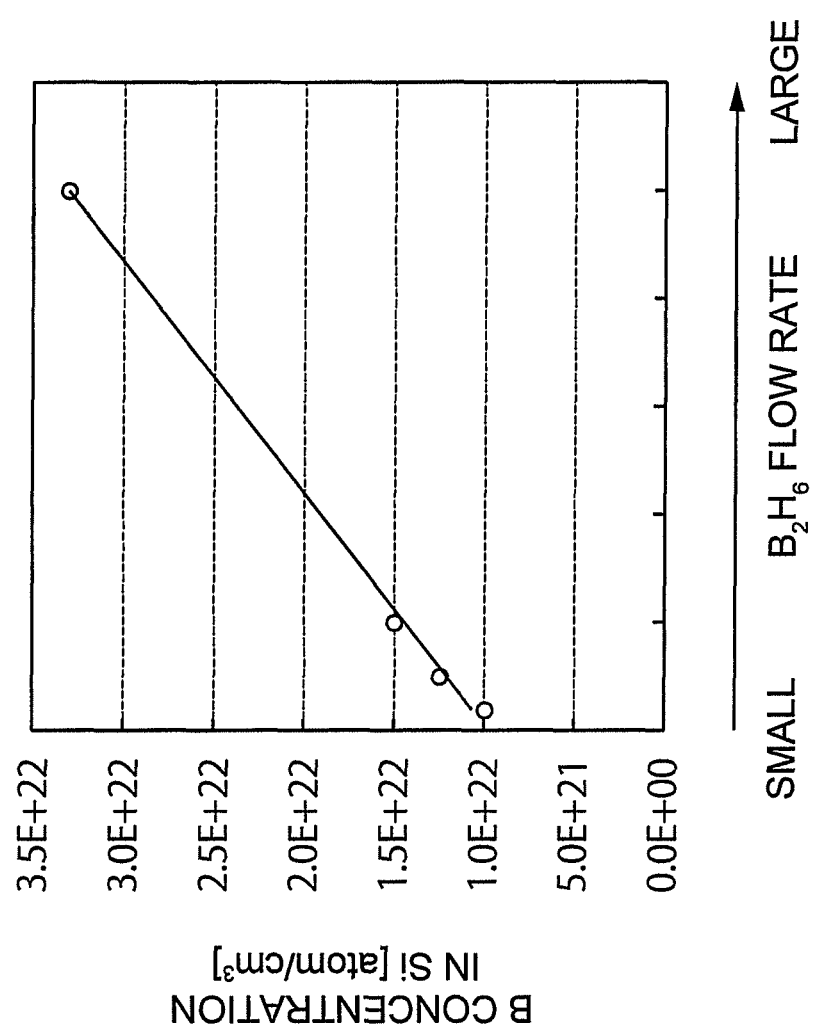
FIG. 13 is a diagram showing a correlation between a flow ratio of $B_2H_6$ and a concentration of boron contained in a silicon layer.

For example, on a condition (condition A) of the SiH$_4$ gas of 100 to 2000 sccm and the B$_2$H$_6$ gas of 500 to 2000 sccm, the silicon layer 4 was formed, and the boron concentration in the silicon layer 4 was analyzed by means of SIMS (Secondary Ion Mass Spectrometry), to be 3.3 E+22 atom/cm$^3$. Further, on a condition (condition B) of the SiH$_4$ gas of 100 to 2000 sccm and the B$_2$H$_6$ gas of 10 to 500 sccm, the silicon layer 4 was formed, and the boron concentration in the silicon layer 4 was analyzed by means of SIMS, to be 1.3 E+22 atom/cm$^3$. FIG. 13 is a summary of results as thus obtained. A lateral axis of FIG. 13 shows the flow ratio of B$_2$H$_6$/SiH$_4$, and a vertical axis thereof shows the boron concentration in the silicon layer 4. The boron concentration changes depending on pressure, a temperature or the like at the time of film formation, but when these conditions are made the same, controlling the flow ratio between B$_2$H$_6$ and SiH$_4$ can lead to a change in boron concentration in the silicon layer 4. For this reason, it is considered that, with the boron concentration changing, the silicon concentration in the silicon layer 4 is also changing.

Further, the silicon layers 4 were formed on the above conditions A and B, and the tungsten crystal nucleuses 5 were generated on each layer as in the first embodiment. Moreover, the surface is observed with the SEM, and from an SEM image thereby obtained, the density of the tungsten initial crystal nucleuses 5 on each surface was measured. As a result, the density of the tungsten initial crystal nucleuses 5 was 11010 nucleuses/μm$^2$ on the condition A, and the density was 12500 nucleuses/μm² on the condition B. It is found from this result that the density of the tungsten initial crystal nucleuses 5 increases with decrease in value of the boron concentration, namely with increase in value of the silicon concentration.

That is, according to the present embodiment, controlling the flow ratio between the $B_2H_6$ gas and the $SiH_4$ gas can lead to control of the silicon concentration in the silicon layer 4 for efficient generation of the tungsten crystal nucleuses 5, thereby to control the density of the tungsten crystal nucleuses 5.

It is to be noted that, both in the first embodiment and the third embodiment, the case was described as the example where the process temperature in the process of generating silicon atoms through use of the reaction between the $B_2H_6$ and $SiH_4$ does not reach the temperature in the vicinity of 600° C. required for thermal decomposition of the $SiH_4$ gas, but even to the case of this process temperature exceeding 600° C., the first embodiment and the third embodiment may be applied. In the case of the process temperature exceeding 600° C. as thus described, there can be used both silicon atoms that are generated through use of the reaction between $B_2H_6$ and $SiH_4$, and silicon atoms that are generated from thermal decomposition of $SiH_4$.

Fourth Embodiment

Although the contact layer 3 was formed on the bottom and the side wall of the via 11 of the silicon oxide film 2 in the first embodiment, the present embodiment is different in that the contact layer 3 made of titanium nitride is selectively formed on an upper part of the side wall inside the via 11 of the silicon oxide film 2. It is thereby possible to change a deposition rate of the tungsten film 6 on an upper part and a lower part of the via 11, so as to form the plug 31 filled with the tungsten film 6.

A method for manufacturing a semiconductor device according to the present embodiment will be described using FIGS. 14A to 14G. These FIGS. 14A to 14G show a manufacturing process for the plug 31, and corresponds to a cross section of the plug 31 having the semiconductor device. It is to be noted that the present invention is not restricted to a plug in such a shape as hereinafter described. Further, a description of a portion in common with the first embodiment will be omitted.

Figure 14B:
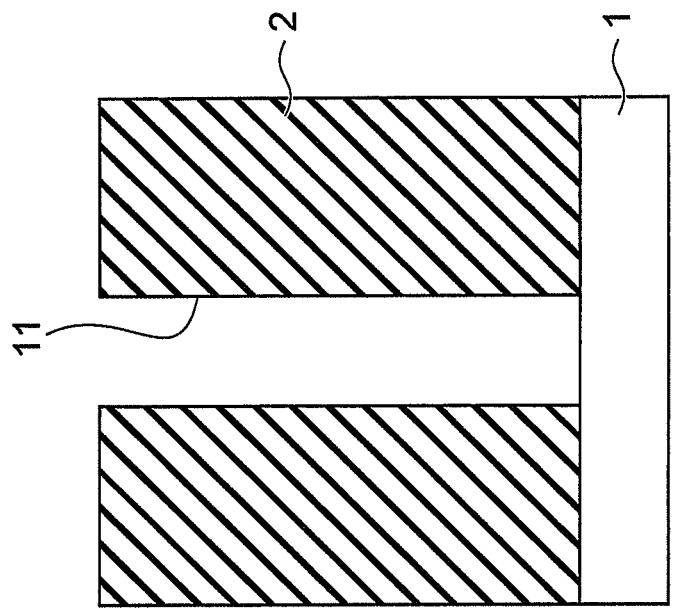
FIGS. 14A to 14G are sectional views for explaining a method for manufacturing a semiconductor device according to a fourth embodiment.
Figure 14A:
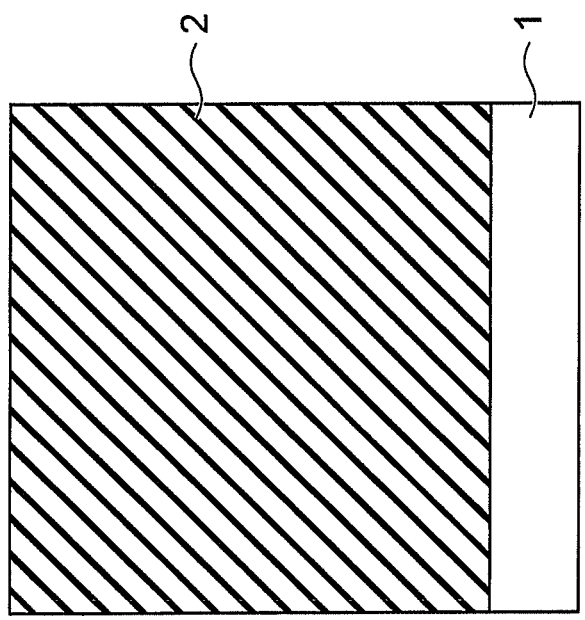

Similarly to the first embodiment, the silicon oxide film 2 is formed on the semiconductor substrate 1 as shown in FIG. 14A, and the via 11 is formed on this silicon oxide film 2 as shown in FIG. 14B.

Figure 14C:
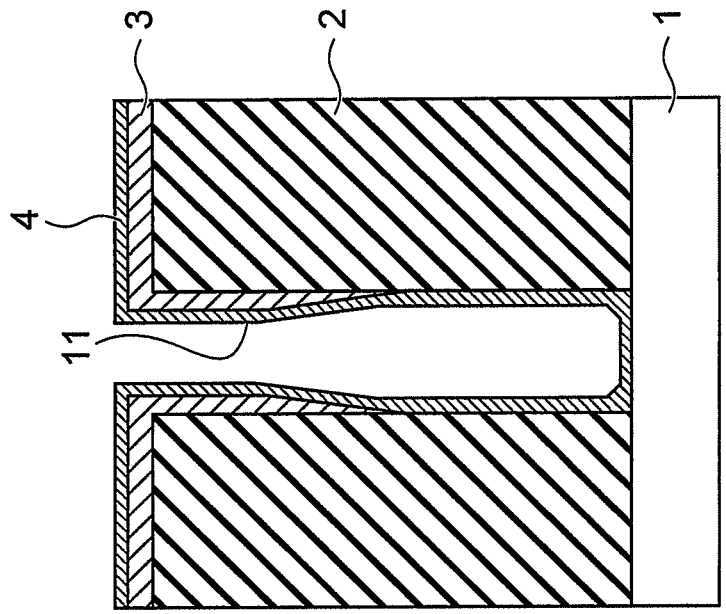

Then, as shown in FIG. 14C, similarly to the first embodiment, the contact layer 3 made of titanium nitride is selectively formed on an upper part of the side wall of the via 11 and on the surface of the silicon oxide film 2 by means of the PVD technique, and the silicon oxide film 2 remains exposed from a middle part to a lower part of the side wall of the via 11. In addition, the contact layer 3 formed on the upper part of the side wall of the via 11 is preferably formed as a continuous film covering the upper part of the side wall of the via 11.

Figure 14D:
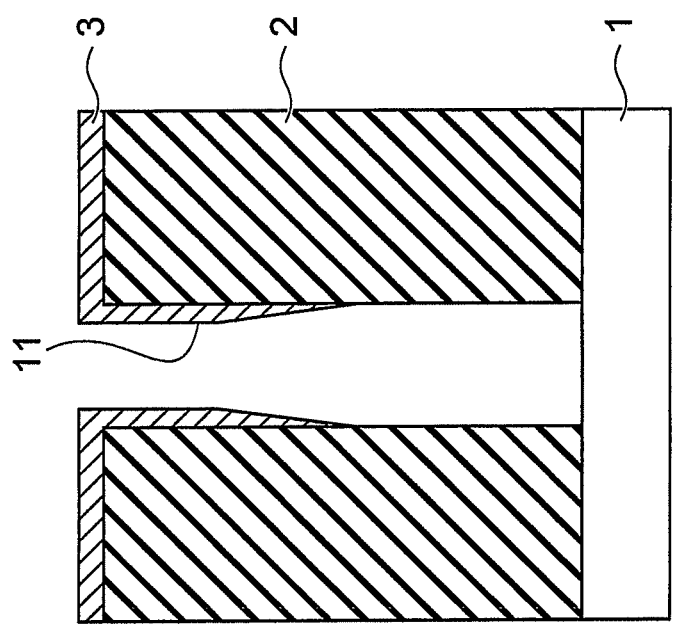

Further, as shown in FIG. 14D, similarly to the first embodiment, a very thin silicon film 4 is formed. At this time, the $B_2H_6$ gas is selectively adsorbed to the titanium nitride film since boron has a high affinity for the titanium nitride film. Therefore, the boron concentration in the silicon layer 4 formed on the contact layer 3 made of titanium nitride located on the upper part of the side wall of the via 11 is higher than the boron concentration in the silicon layer 4 formed on the middle part to the lower part of the side wall of the via 11. In accordance with this, the silicon concentration in the silicon layer 4 formed on the contact layer 3 located on the upper part of the side wall of the via 11 is lower than the silicon concentration in the silicon layer 4 formed on the middle part to the lower part of the side wall of the via 11. That is, selectively forming the contact layer made of titanium nitride can lead to a change in concentrations of boron and silicon in the silicon layer 4 formed inside the via 11. In the present embodiment, previously forming the contact layer made of titanium nitride in a desired position can facilitate to change the concentrations of boron and silicon contained in the silicon layer 4 in accordance with the above positions.

Figure 14F:
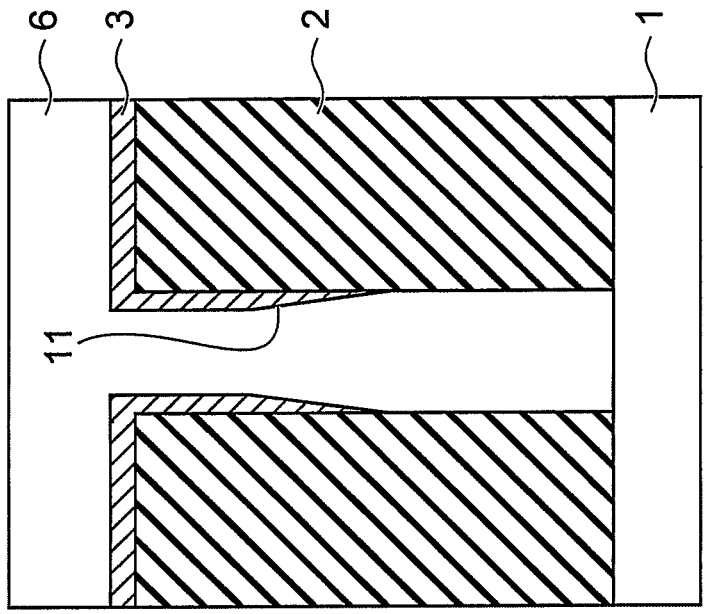
Figure 14E:
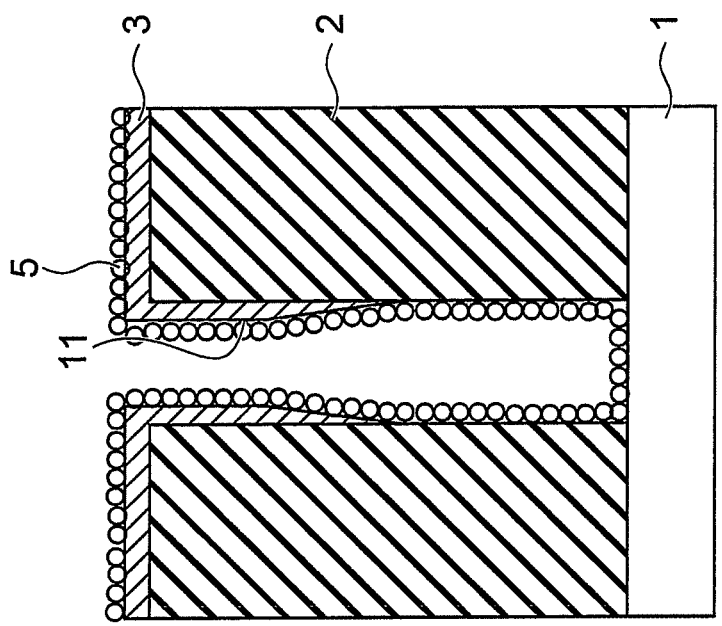

Next, as show in FIGS. 14E and 14F, the tungsten film 6 is embedded into the via 11 by means of the CVD method similarly to the first embodiment. At this time, as described above, the silicon concentration in the silicon layer 4 formed on the contact layer 3 made of titanium nitride located on the upper part of the side wall of the via 11 is lower than the silicon concentration in the silicon layer 4 formed on the middle part to the lower part of the side wall of the via 11, and hence the density of the tungsten crystal nucleuses 5 formed through the reaction with silicon is also lower on the contact layer 3 located on the upper part of the side wall of the via 11 than on the middle part to the lower part of the side wall of the via 11. Then, with the densities of the tungsten crystal nucleuses 5 being different, the deposition rate of the tungsten film 6 deposited on the upper part of the side wall of the via 11 is slower than the deposition rate of the tungsten film 6 deposited on the middle part to the lower part of the side wall of the via 11. In this manner, it is possible to avoid such a state that the plug 31 with an embedment defect is undesirably formed, where the tungsten film 6 is deposited in advance in the vicinity of the opening of the via 11 to block the opening of the via 11 and prevent the tungsten film 6 from being embedded into the lower part of the via 11, so as to form the plug 31 having the via 11 sufficiently filled with the tungsten film 6.

Figure 14G:
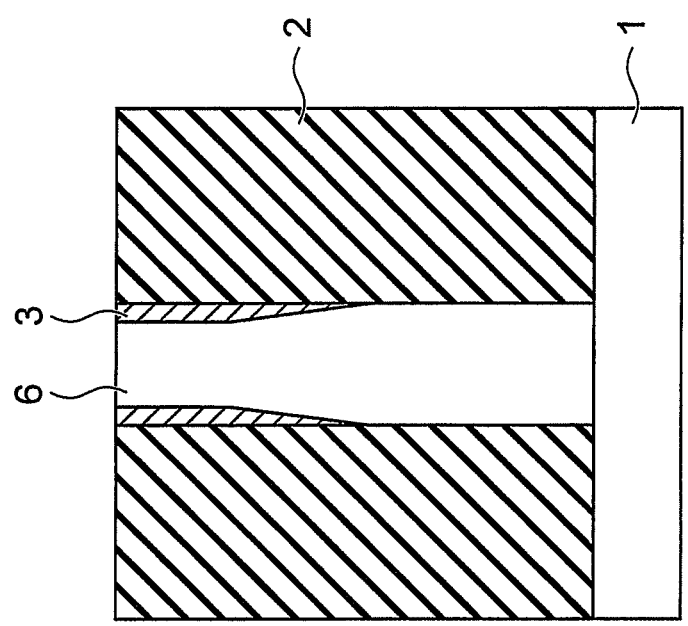

Next, as shown in FIG. 14G, similarly to the first embodiment, the tungsten film 6 and the contact layer 3 protruding from the via 11 are polished and removed by means of CMP, to form the plug 31.

It is to be noted that, although the difference in deposition rate of the tungsten film 6 in accordance with the difference in boron concentration in the silicon layer 4 was used in the present embodiment, boron is not restrictive in the present embodiment, but a material that is not reacted with the $WF_6$ gas may be used in place of boron, and examples of such a material include P (phosphorus), C (carbon) and Ge (germanium). For example, a $PH_3$ gas is introduced in the case of using P, a $SiH_3CH_3$ gas is introduced in the case of using C, and a $GeH_4$ gas is introduced in the case of using Ge.

Further, in the present embodiment, the contact layer 3 that is formed on the upper part of the via 11 of the silicon oxide film 2 is not restricted to the titanium nitride film, but even in the case of forming the contact layer 3 of a titanium film, a tantalum film, a tantalum nitride film, a nitride tungsten film or the like, a similar effect can be obtained to the case of forming the layer of the titanium nitride film.

Figure 15:
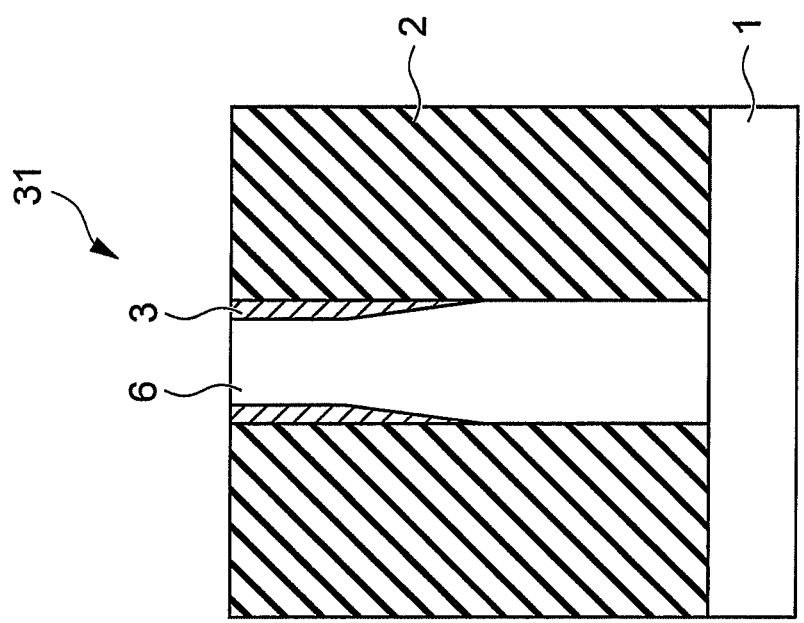
FIG. 15 is a sectional view of the semiconductor device according to the fourth embodiment.

In such a manner as described above, the plug 31 shown in a sectional view of FIG. 15 is formed. Specifically, the plug 31 of the present embodiment is made up of the via 11 provided in the silicon oxide film 2 formed on the semiconductor substrate 1, the contact layer 3 made of titanium nitride formed on the upper part of the side wall of the via 11, and the tungsten film 6 embedded into the via 11. Further, the boron concentration between the tungsten film 6 and the contact layer 3 formed on the upper part of the side wall of the via 11 is higher than the concentration of boron between the tungsten film 6 and the middle part and lower part of the side wall of the via 11. Further, it is preferable that the silicon layer 4 formed before embedment of the tungsten film 6 be replaced by tungsten and not remain eventually on the contact layer 3, but part of the silicon layer 4 may remain on the contact layer 3.

According to the present embodiment, by selectively forming the contact layer 3 made of titanium nitride on the upper part of the side wall of the via 11, the boron concentration in the silicon layer 4 formed on the contact layer 3 on the upper part of the side wall of the via 11 becomes higher than the boron concentration in the silicon layer 4 formed on the middle part to the lower part of the side wall of the via 11. On the contrary to this, the silicon concentration in the silicon layer 4 formed on the contact layer 3 becomes lower than the silicon concentration in the silicon layer 4 formed on the middle part to the lower part of the side wall of the via 11. Changing the silicon concentration in the silicon layer 4 in such a manner can make slower the deposition rate of the tungsten film 6 deposited on the upper part of the side wall of the via 11 than the deposition rate of the tungsten film 6 deposited on the middle part to the lower part of the side wall of the via 11. It is thereby possible to avoid such a state that the tungsten film 6 is deposited in advance in the vicinity of the opening of the via 11 to block the opening of the via 11 and prevent the tungsten film 6 from being embedded into the lower part of the via 11. That is, it is possible to obtain such a plug 31 with improved embedment properties that the via 11 is sufficiently filled with the tungsten film 6.

In the present embodiment, samples as follows were created in order to make certain that the difference is made in concentrations of boron and silicon in the silicon layer formed on the titanium nitride film 23 as the contact layer 3 in accordance with the presence or absence of the titanium nitride film, and concentrations of boron and silicon in each sample were analyzed by means of EELS (Electron Energy-Loss Spectroscopy).

Figure 16:
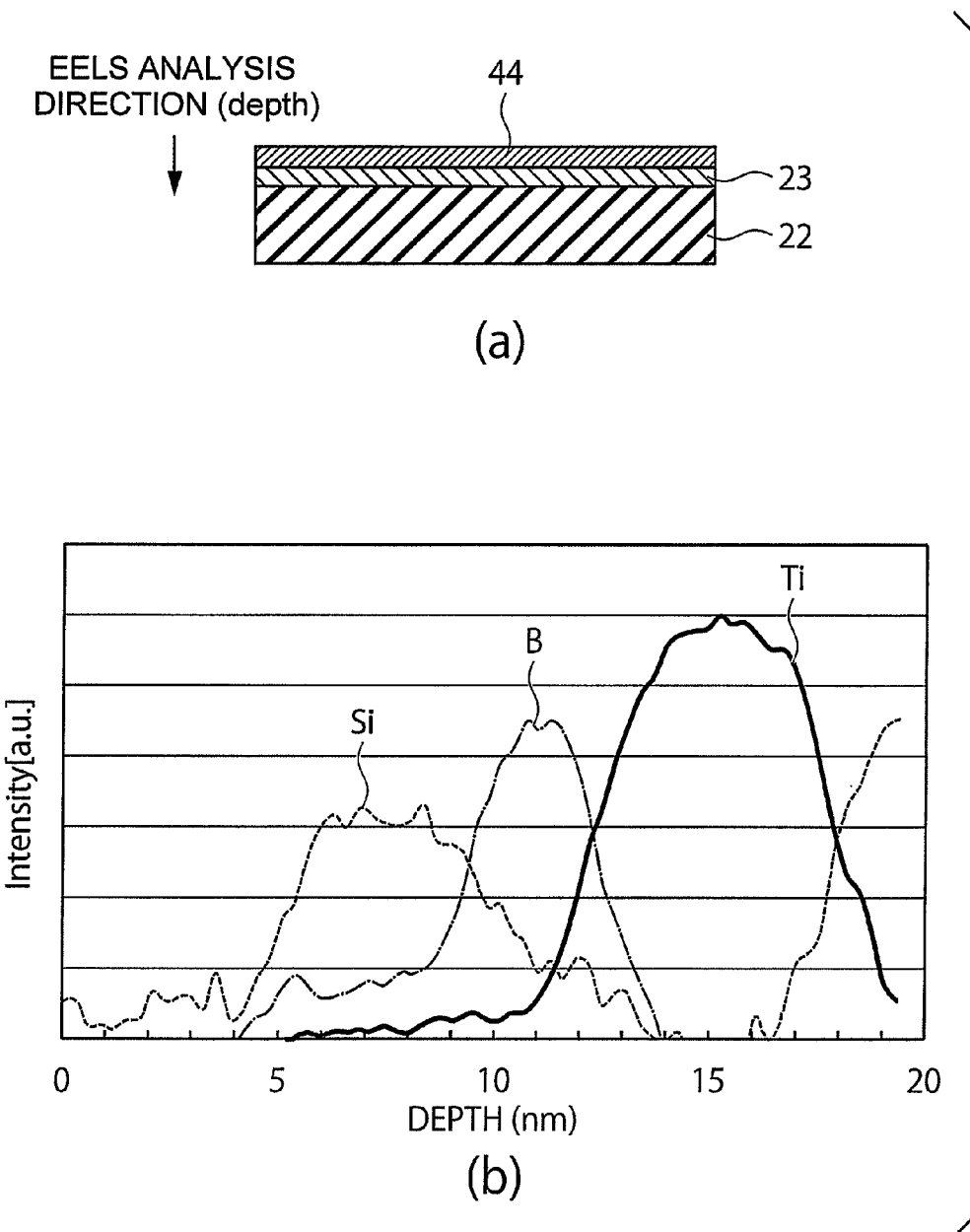
FIG. 16 is a measurement result for a boron concentration in a silicon layer formed on a titanium nitride film.

As shown in FIG. 16(*a*), similarly to the manufacturing method of the present embodiment, the sample A corresponding to the present embodiment described above was formed such that the $B_2H_6$ gas was introduced into the film formation chamber, not followed by purging, and the $SiH_4$ gas was introduced, to form a thick silicon layer 44 on the titanium nitride film 23. The boron concentration in the silicon layer 44 was measured by means of EELS, to make certain that the boron concentration is high on the titanium nitride film 23 side, corresponding to the lower layer, of the silicon layer 44 as compared with the upper layer side of the silicon layer 44, as shown in FIG. 16(*b*). Further, it was made certain that the silicon concentration is low on the titanium nitride film 23 side, corresponding to the lower layer, of the silicon layer 44 as compared with the upper layer side of the silicon layer 44.

On the other hand, the sample B as the comparative example was formed such that the thick silicon layer 44 was formed in a similar manner to the method for forming the sample A, without formation of the titanium nitride film 23 on the silicon oxide film 22. When the boron concentration in the silicon layer 44 was measured by means of EELS, the difference of the boron concentration on the titanium nitride film 23 side, corresponding to the lower layer, of the silicon layer 44 from the boron concentration on the upper layer side of the silicon layer 44 was not large as compared with the sample A.

It is considered from the above that in formation of the silicon layer 44, in the case of introducing the $B_2H_6$ gas into the film formation chamber, the boron concentration in the silicon layer 44 immediately on the titanium nitride film 23 becomes high due to the $B_2H_6$ gas having been selectively adsorbed to the titanium nitride film 23, and further, the $B_2H_6$ gas is not selectively adsorbed on the silicon oxide film 22, whereby no difference was recognized in the boron concentration in the silicon layer 44 on the silicon oxide film.

That is, it was found that the boron concentration in the silicon layer 44 formed on the titanium nitride film 23 changes in accordance with the presence or absence of the titanium nitride film.

Further, in the present embodiment, samples as follows were created in order to make certain that the deposition rate of the tungsten film 6 deposited on the titanium nitride film as the contact layer 3 differs in accordance with the presence or absence of the titanium nitride film, and a deposited amount of the tungsten film 6 of each sample was measured by means of fluorescent X-ray analysis.

Figure 17:
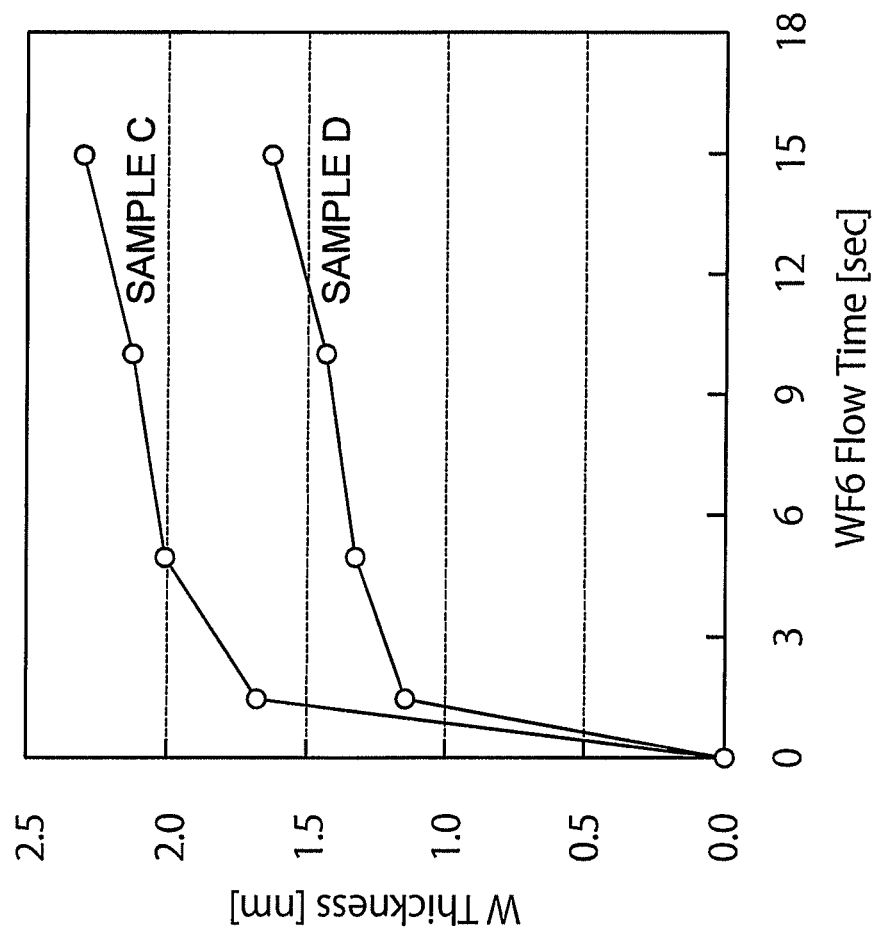
FIG. 17 is a measurement result showing a correlation between the presence or absence of the titanium nitride film and a deposited amount of the tungsten film.

A sample C is one obtained by forming the silicon layer 4 having a film thickness of 0.2 to 30 nm on the silicon oxide film 2, and a sample D is one obtained by forming a titanium nitride film on the silicon oxide film 2 and forming thereon the silicon layer 4 having a film thickness of 0.2 to 30 nm. Then, on a condition of 1 to 100000 Pa, the $WF_6$ gas of 100 to 1000 sccm was allowed to flow, to deposit the tungsten film 6 on each sample, and a deposited amount of the tungsten film 6 on each sample was measured by the fluorescent X-ray analysis. A result of this is shown in FIG. 17. It was made certain that, as shown in FIG. 17, the deposited amount of the tungsten film 6 of the sample C is 1.5 times as large as the deposited amount of the tungsten film 6 of the sample D.

That is, it was made certain that the deposition rate of the tungsten film 6 deposited on the titanium nitride film 6 differs in accordance with the presence or absence of the titanium nitride film.

It should be noted that as the method for making a difference between the boron concentration in the silicon layer 4 formed on the middle part to the lower part of the side wall of the via 11 and the boron concentration in the silicon layer 4 formed on the upper part of the side wall of the via 11, conditions for forming the silicon layer 4 can be changed. For example, similarly to the third embodiment, since controlling flow rates of the $B_2H_6$ gas and the $SiH_4$ gas at the time of formation of the silicon layer 4 can lead to adjustment of the boron concentration in the silicon layer 4, the silicon layer 4 with a lower boron concentration is first formed in a conformal manner in the via 11, and the silicon layer 4 with a higher boron concentration is formed on a condition of causing deterioration in coverage of the silicon layer 4, e.g., a supply rate determining condition, whereby it is possible to form the silicon layer 4 such that the boron concentration in the silicon layer 4 formed on the middle part to the lower part of the side wall of the via 11 is lower and the boron concentration in the silicon layer 4 formed on the upper part of the side wall of the via 11 is higher.

In addition, although the titanium nitride film as the contact layer 3 was described as one formed by means of the PVD technique in the first to fourth embodiments, this is not restrictive, and a similar effect can be obtained even when a thin titanium nitride film is formed by means of the CVD technique or an ALD (Atomic Layer Deposition) technique. This is because, a continuous, uniform and conformal titanium nitride film cannot necessarily be formed inside the via 11 with a high aspect ratio even by use of these techniques. Even in these cases, similar effects to the first to fourth embodiments can be obtained by using these embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device having a plug, the plug comprising:
   a via provided in a silicon oxide film on a semiconductor substrate;
   a contact layer selectively formed on an upper part of a side wall inside the via; and
   a tungsten film embedded in the via,
   wherein the plug contains boron, and a concentration of boron contained between the tungsten film and the contact layer selectively formed on the upper part of the side wall inside the via is high as compared with a concentration of boron contained between the tungsten film and a middle part and a lower part of the side wall of the via.

2. The semiconductor device according to claim 1, wherein the contact layer is made of one of a titanium nitride film, a titanium film, a tantalum film, a tantalum nitride film and a nitride tungsten film.

3. The semiconductor device according to claim 1, wherein the plug is further provided with a silicon layer on the contact layer and the tungsten film is located on the silicon layer.

* * * * *